(12) United States Patent
You

(10) Patent No.: US 11,461,227 B2
(45) Date of Patent: Oct. 4, 2022

(54) STORAGE DEVICE AND OPERATING METHOD THEREOF

(71) Applicant: SK hynix Inc., Gyeonggi-do (KR)

(72) Inventor: Byoung Sung You, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/016,945

(22) Filed: Sep. 10, 2020

(65) Prior Publication Data

US 2020/0409836 A1 Dec. 31, 2020

Related U.S. Application Data

(63) Continuation of application No. 16/172,385, filed on Oct. 26, 2018, now Pat. No. 10,802,959.

(30) Foreign Application Priority Data

Mar. 13, 2018 (KR) .......................... 10-2018-0029341

(51) Int. Cl.
  *G06F 12/02* (2006.01)
  *G11C 16/04* (2006.01)
  *G11C 16/16* (2006.01)

(52) U.S. Cl.
  CPC ...... *G06F 12/0246* (2013.01); *G11C 16/0483* (2013.01); *G11C 16/16* (2013.01)

(58) Field of Classification Search
  CPC ............... G06F 12/023; G06F 12/0238; G06F 12/0246; G11C 16/0483; G11C 16/102; G11C 16/105; G11C 16/16
  USPC ..... 711/103, 202–209, E12.008; 365/185.29, 365/218, 185
  See application file for complete search history.

(56) References Cited

U.S. PATENT DOCUMENTS

| 9,311,006 | B2 * | 4/2016 | Moshayedi | G06F 11/1441 |
| 2008/0219053 | A1 * | 9/2008 | Kim | G11C 16/349 365/185.11 |
| 2014/0204672 | A1 * | 7/2014 | Lee | G11C 16/16 365/185.12 |
| 2015/0009754 | A1 * | 1/2015 | Kim | G11C 16/3427 365/185.12 |
| 2016/0188208 | A1 | 6/2016 | Kim et al. | |

(Continued)

FOREIGN PATENT DOCUMENTS

| CN | 101681677 A | 3/2010 |
| CN | 102163456 A | 8/2011 |

(Continued)

OTHER PUBLICATIONS

Office Action issued by the Chinese Patent Office dated Apr. 20, 2022.

*Primary Examiner* — Ilwoo Park
(74) *Attorney, Agent, or Firm* — IP & T Group LLP

(57) ABSTRACT

A storage device for performing a garbage collection operation using a partial block erase operation includes: a memory device including a plurality of main blocks each including a plurality of sub-blocks; and a memory controller configured to perform a garbage collection operation for securing free blocks in which no data is stored, among the main blocks, wherein the memory controller includes a write handler configured to erase at least a portion of a target block, among the main blocks, according to whether an amount of valid data in at least one victim block exceeds a storage capacity of one main block.

5 Claims, 22 Drawing Sheets

(56) References Cited

U.S. PATENT DOCUMENTS

2018/0275875 A1* 9/2018 Yonezawa ............. G06F 3/0658
2018/0373655 A1* 12/2018 Liu ...................... G06F 13/30
2019/0196744 A1* 6/2019 Kim ..................... G11C 16/14

FOREIGN PATENT DOCUMENTS

| CN | 103456357 A | 12/2013 |
| CN | 104102456 A | 10/2014 |
| CN | 106504789 A | 3/2017 |
| CN | 106575256 A | 4/2017 |
| CN | 106802768 A | 6/2017 |
| WO | 2015/196153 A1 | 12/2015 |

* cited by examiner

| Operation | | Selected Sub-Blocks (Selected Pages) | Unselected Sub-Blocks (Unselected Pages) |
|---|---|---|---|
| Erase | Erase | 0V (grouping) | Floating |
| | HEV | HEV | Vpass_r |

| Feature DATA | Description |
|---|---|
| P1 (Sub feature parameter 1) | Start of Page Number (Pointer) |
| P2 (Sub feature parameter 2) | Flexible Partition Boundary 1 |
| P3 (Sub feature parameter 3) | Flexible Partition Boundary 2 |
| P4 (Sub feature parameter 4) | Flexible Partition Boundary 3 |

FIG. 14

| Block Usage | Type | Fraction BLK # | BLK Amount | Page Amount | CH0 CE0 Plane0 | CH0 CE0 Plane1 | CH0 CE1 Plane0 | CH0 CE1 Plane1 | CH1 CE0 Plane0 | CH1 CE0 Plane1 | CH1 CE1 Plane0 | CH1 CE1 Plane1 |
|---|---|---|---|---|---|---|---|---|---|---|---|---|
| FW/C1 | SLC Fblock Partial BLK | BLK0-0 | 0, 1 | 7(208KB) | Main FW[0] | Main FW[0] | Main FW[2] | Main FW[2] | Main FW[1] | Main FW[1] | Main FW[3] | Main FW[3] |
| FW/C1 | SLC Fblock Partial BLK | BLK0-1 | 2, 3 | 1(512B) | C1[0] | C1[1] | C1 Spare (6 Fblock) | | | | | |
| SBI/Boot/RPMB | SLC Xblock Partial BLK | BLK0-2 | 1 | 1(4KB) | SBI[0] | SBI[1] | SBI Spare ( 6 Blocks) | | | | | |
|  |  | BLK0-3 | 1 | 1(10KB) | Boot1 | Boot2 | BOOT/RPMB Spare(2) | RPMB |  |  | BOOT/RPMB Spare(3) | |
|  |  | BLK0-4 | 1 | 1(10KB) | BOOT/RPMB Spare(8) | | | | | | | |
| UDA | SLC Xblock Partial BLK (In-place update) | BLK1<0:5> / BLK2<0:1> | 8 | 36(1MB) | Open Block (Xblock 8) | | | | | | | |
|  |  | BLK2<2:5> / BLK3<0:3> | 8 | 36(1MB) | L1+P1+C2+C3+etc (Xblock 8) | | | | | | | |
|  |  | BLK3<4:5> / BLK4<0:4> | 7 | 36(1MB) | P2 (Xblock 7) | | | | | | | |
|  |  | BLK5<5> / BLK4<0:5> | 7 | 36(1MB) | L2 (Xblock 7) | | | | | | | |
|  |  | BLK5<0> | 1 | 36(1MB) | RMA (Xblock 1) | | | | | | | |
|  |  | BLK5<1> | 1 | 36(1MB) | Open Block (Xblock 1) | | | | | | | |
|  | Xblock |  | 829 |  | Data Block(93.1%) | | | | | | | |
|  | Xblock |  | 61 |  | Spare(Over-Provisioning 6.9%) | | | | | | | |
|  | Xblock |  | 24 |  | Extended Spare(Over-Provisioning 2.7%) From Partial System Block | | | | | | | |
| Reserved | Xblock |  | 19 |  | Initial BB (2%) | | | | | | | |

STORAGE DEVICE AND OPERATING METHOD THEREOF

CROSS-REFERENCE TO RELATED APPLICATION

This application is a continuation of U.S. patent application Ser. No. 16/172,385 filed on Oct. 26, 2018, which claims benefits of priority of Korean Patent Application No. 10-2018-0029341 filed on Mar. 13, 2018. The disclosure of each of the foregoing application is incorporated herein by reference in its entirety.

BACKGROUND

1. Field of Invention

The present disclosure generally relates to an electronic device, and more particularly, to a storage device and an operating method thereof.

2. Description of Related Art

A storage device stores data under the control of a host device such as a computer, a smart phone or a smart pad. The storage device includes a device for storing data on a magnetic disk, such as a Hard Disk Drive (HDD), or a device for storing data on a semiconductor memory, i.e., a nonvolatile memory, such as a Solid State Drive (SSD) or a memory card.

The storage device may include a memory device for storing data and a memory controller for controlling the memory device. The memory device may be a volatile memory device or a nonvolatile memory device. The nonvolatile memory device may be a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), or the like.

SUMMARY

Embodiments provide a storage device for performing a garbage collection operation using a partial block erase operation and an operating method of the storage device.

According to an aspect of the present disclosure, there is provided a storage device including: a memory device including a plurality of main blocks each including a plurality of sub-blocks; and a memory controller configured to perform a garbage collection operation for securing free blocks in which no data is stored, among the main blocks, wherein the memory controller includes a write handler configured to erase at least a portion of a target block, among the main blocks, according to whether an amount of valid data in at least one victim block exceeds a storage capacity of one main block.

According to another aspect of the present disclosure, there is provided a method for operating a storage device that includes a memory device including a plurality of main blocks each including a plurality of sub-blocks and a memory controller for performing a garbage collection operation for securing free blocks in which no data is stored among the main blocks, the method comprising: determining whether an amount of valid data in at least one victim block, among the main blocks, exceeds a storage capacity of one main block; and erasing at least a portion of a target block, among the main blocks, based on a result of the determining operation.

According to an aspect of the present disclosure, there is provided a storage device including: a memory device including: first and second main blocks each including a plurality of pages; and a sub-block setting component configured to store information of one or more sub-blocks each including one or more groups of the pages; and a controller configured to control the memory device to perform, according to the information stored in the sub-block setting component, an erase operation to one or more sub-blocks storing invalid data among the sub-blocks of the first main block in a garbage collection operation to the first and second main blocks respectively as target and victim blocks, wherein an amount of the invalid data stored in the first main block is greater than an amount of valid data stored in the second main block.

BRIEF DESCRIPTION OF THE DRAWINGS

Various embodiments will now be described more fully with reference to the accompanying drawings; however, elements and features may be configured or arranged differently than illustrated and described herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment," "another embodiment," or the like is not necessarily to only one embodiment, and different references to any such phrase are not necessarily to the same embodiment(s).

FIG. 14 is a diagram illustrating a use state of a system block according to an embodiment of the present disclosure.

DETAILED DESCRIPTION

Figure 1:
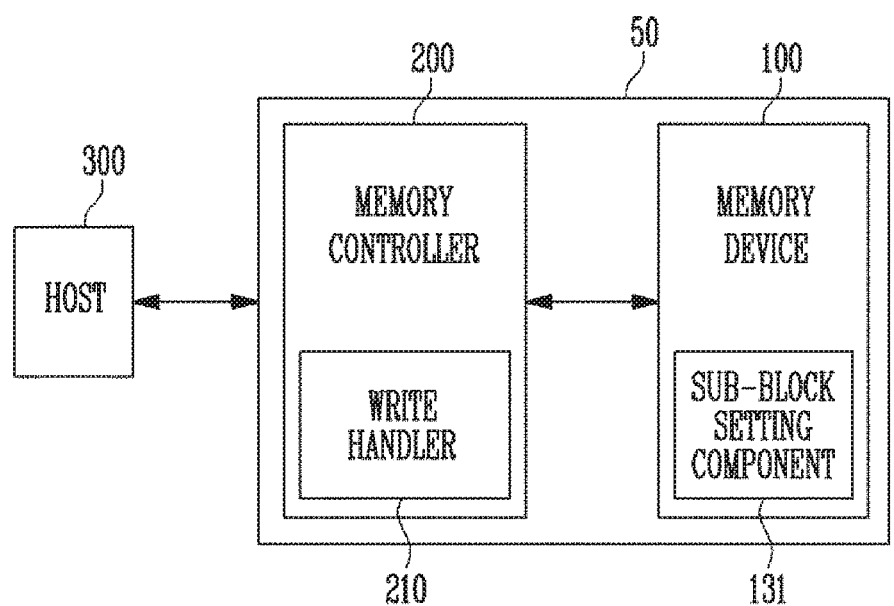
FIG. 1 is a block diagram illustrating a storage device according to an embodiment of the present disclosure.

The specific structural and functional description herein is for the purpose of describing embodiments of the present disclosure. The disclosed embodiments may be implemented in various ways, and thus the present invention is not limited to the embodiments set forth herein.

The disclosed embodiments may be modified in various ways, including in the configurations and shapes of devices and components. Thus, embodiments of the present disclosure are not limited to specified shapes or configurations. Rather, the present disclosure includes all changes, equivalents, or substitutes that do not depart from the spirit and technical scope of the present disclosure.

While terms such as "first" and "second" may be used to identify various components, such components are not limited by the above terms. The above terms are used only to distinguish one component from another that otherwise have the same or similar names. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms and vice versa, unless the context clearly indicates otherwise. It will be further understood that terms such as "including" or "having," etc., are intended to indicate the existence of the stated features, numbers, operations, actions, components, parts, or combinations thereof but are not intended to preclude the possibility that one or more other features, numbers, operations, actions, components, parts, or combinations thereof may be present or added.

So far as not being differently defined, all terms used herein including technical or scientific terminologies have meanings that are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description of techniques that are well known to the art to which the present disclosure pertains and not directly related to the present disclosure may be omitted so as not to unnecessarily obscure description of features of the present disclosure.

Various embodiments of the present disclosure will be described in detail with reference to the accompanying drawings in order for those skilled in the art to be able to practice the present disclosure.

FIG. 1 is a block diagram illustrating a storage device according to an embodiment of the present disclosure.

Referring to FIG. 1, the storage device 50 may include a memory device 100 and a memory controller 200.

The storage device 50 stores data under the control of a host 300, such as a mobile phone, a smart phone, an MP3 player, a laptop computer, a desktop computer, a game console, a TV, a tablet PC or an in-vehicle infotainment.

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for performing an erase operation.

The memory block may be as one of a free block, an open block, and a closed block according to whether data is stored therein. The free block may be a memory block that is empty without storing any data. The open block may be a memory block in which data is partially store d. The closed block may be a memory block in which data is entirely stored.

In an embodiment, one memory block may include a plurality of sub-blocks. The size of the sub-block may be variously set under the control of the memory controller 200.

In an embodiment, the memory device 100 of the present disclosure may perform an erase operation in units of sub-blocks. When one memory block includes a plurality of sub-blocks, the memory device 100 may erase a specific sub-block in the memory block. That is, the memory device 100 may erase a portion of the memory block. In this specification, the memory block is defined as a main block. One main block may include a plurality of sub-blocks, and the size of the sub-block may be changed by the memory controller 200. An erase operation performed in units of main blocks is referred to as a normal erase operation, and an erase operation performed in units of sub-blocks is referred to as a partial block erase operation.

The memory device 100 may further include a sub-block setting component 131. The sub-block setting component 131 may set a size of the sub-block. The sub-block setting component 131 may be implemented with a register. In an embodiment, the sub-block setting component 131 may be implemented with an SRAM. The memory device 100 may set a size of the sub-block according to a value stored in the sub-block setting component 131.

In an embodiment, the memory device 100 may set feature data of the sub-block setting component 131 in response to a set feature command provided from the memory controller 200. Therefore, the size of the sub-block of the memory device 100 may be changed under the control of the memory controller 200.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

In an embodiment, the memory device 100 may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control an operation of the memory device 100 in response to a request from the host 300 or regardless of the request from the host 300.

For example, the memory controller 200 may control the memory device 100 to perform a program operation, a read operation, an erase operation, or the like in response to a request from the host 300. In the program operation, the memory controller 200 may provide a program command, a physical address, and data to the memory device 100. In the read operation, the memory controller 200 may provide a read command and a physical address to the memory device 100. In the erase operation, the memory controller 200 may provide an erase command and a physical address to the memory device 100.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

The memory controller 200 may further include a write handler 210.

The write handler 210 may receive and process a write request input from the host 300.

When the write request is input from the host 300, the write handler 210 may determine whether the number of currently free blocks in the memory device 100 is sufficient. When the number of currently free blocks is not sufficient, the write handler 210 may perform a garbage collection operation for securing more free blocks.

For example, when the number of currently free blocks exceeds a first reference value TH1, free blocks are in sufficient supply, and therefore, the write handler 210 may store data in the free blocks in response to the input write request.

When the number of currently free blocks is less than or equal to the first reference value TH1, the write handler 210 may perform a garbage collection operation.

In an embodiment, the write handler 210 may determine whether the garbage collection operation is to be performed as a background operation or a foreground operation according to whether the number of currently free blocks exceeds a second reference value TH2. The background operation may be an operation performed while the memory device 110 is in an idle state. The memory device 100 may not perform another operation while the garbage collection operation is being performed as the foreground operation.

For example, when the number of currently free blocks exceeds the second reference value TH2, the write handler 210 may perform the garbage collection operation as the background operation. When the number of currently free blocks is less than or equal to the second reference value TH2, the write handler 210 may perform the garbage collection operation as the foreground operation.

In an embodiment, the first reference value TH1 is larger than the second reference value TH2.

In various embodiments, the write handler 210 may select at least one of the victim blocks so as to perform the garbage collection operation. Closed blocks may Include valid data and invalid data therein. The victim block may be determined according to an amount of the valid data or the invalid data, which is included in the closed blocks. For example, memory blocks of which the amount of valid data is a certain amount or less may be selected as victim blocks among the memory blocks.

If the amount of valid data stored in the victim blocks exceeds a storage capacity of a single memory block when the garbage collection operation is performed as the foreground operation, the write handler 210 may perform a normal erase operation in the garbage collection operation.

In an embodiment, if the amount of valid data stored in the victim blocks smaller than that of a storage capacity of a single memory block, the write handler 210 may perform a partial block erase operation in the garbage collection operation.

The garbage collection operation performed under the control of the write handler 210 will be described in more detail later with reference to FIGS. 12 to 16.

The memory controller 200 may execute firmware (FW) for controlling the memory device 100. When the memory device 100 is a flash memory device, the memory controller 200 may be configured to operate firmware such as a Flash Translation Layer (FTL) for controlling communication between the host 300 and the memory device 100. Specifically, the memory controller 200 may translate a logical address included in a request from the host 300 into a physical address that is an address to be provided to the memory device 100.

The memory controller 200 may include a buffer memory (not shown). In an embodiment, the memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands, which are executed by the memory controller 200. Alternatively, the buffer memory may store data processed by the memory controller 200. Also, the buffer memory may store a logical-physical address mapping table that establishes a mapping relationship between logical and physical addresses.

In an embodiment, the buffer memory may be implemented with a Dynamic Random Access Memory (DRAM) such as a Double Data Rate Synchronous DRAM (DDR SDRAM), a Low Power Double Data Rate4 (LPDDR4) SDRAM, a Graphics Double Data Rate (GDDR) SDRAM, a Low Power DDR (LPDDR) or a Rambus Dynamic Random Access Memory (RDRAM), or a Static Random Access Memory (SRAM).

In an embodiment, the memory controller 200 may control at least two memory devices 100. The memory controller 200 may control the memory devices 100 according to an Interleaving scheme so as to improve operational performance.

The host 300 may communicate with the storage device 50 using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The storage device 50 may be manufactured as any one of various types of storage devices according to a host interface that enables communication with the host 300. For example, the storage device 50 may be implemented with any one of various types of storage devices such as a multi-media card of a Solid State Drive (SSD), a Multi-Media Card (MMC), an embedded, Multi-Media Card (eMMC), a Reduced Size, Multi-Media Card (RS-MMC), and a micro-Multi-Media Card (micro-MMC) type, a Secure Digital (SD) card of a Secure Digital (SD), a mini-Secure Digital (mini-SD) and a micro-Secure Digital (micro-SD) type, an Universal Storage Bus (USB) storage device, a Universal Flash Storage (UFS) device, a storage device of a Personal Computer Memory Card International Association (PCMCIA) card type, a storage device of a Peripheral Component Interconnection (PCI) card type, a storage device of a PCI-Express (PCI-E) card type, a Compact Flash (CF) card, a smart media card, and a memory stick.

The storage device 50 may be manufactured as any one of various kinds of package types. For example, the storage device 50 may be manufactured as any one of a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

Figure 2:
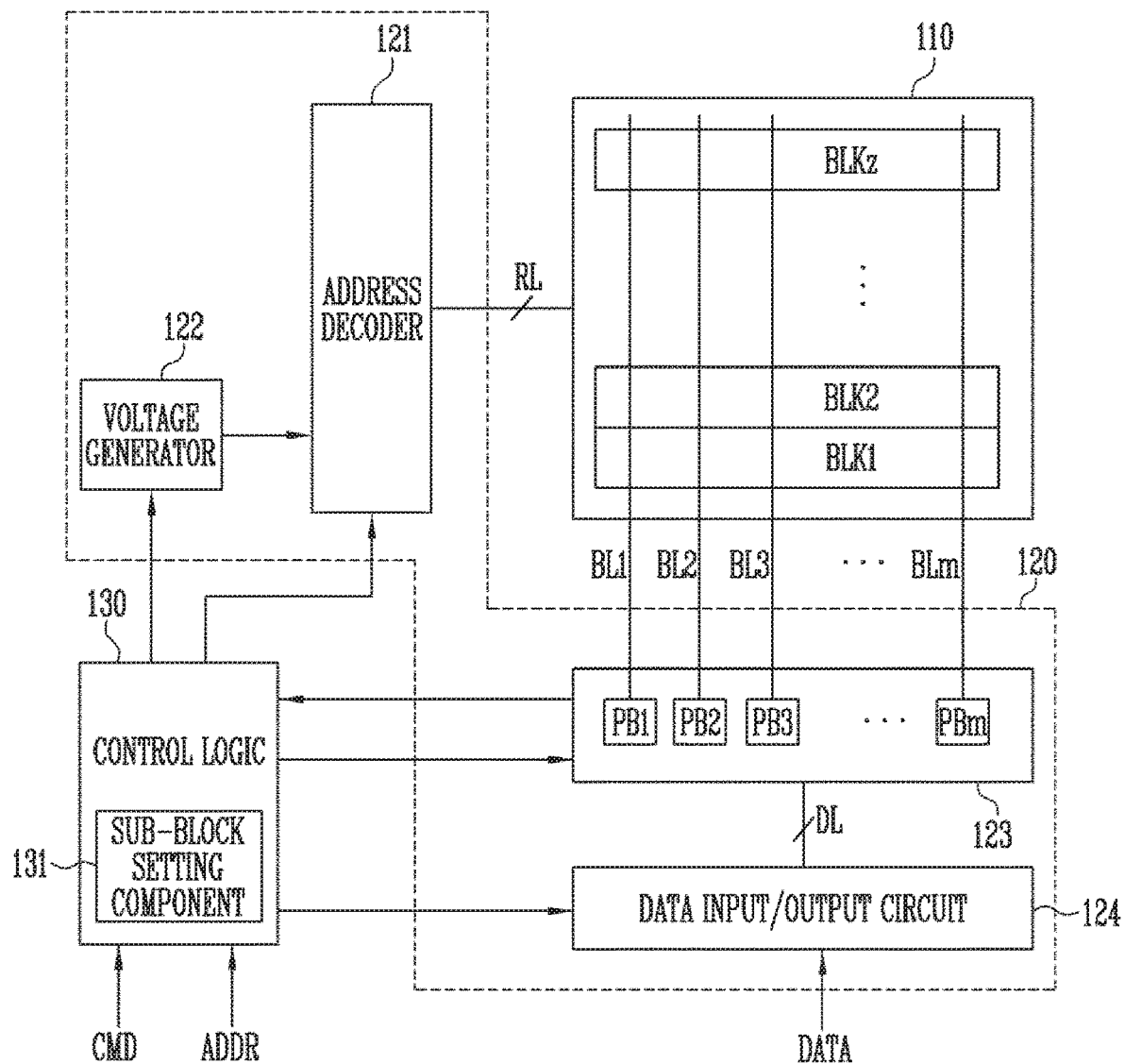
FIG. 2 is a diagram illustrating a structure of a memory device of FIG. 1 according to an embodiment of the present disclosure.

FIG. 2 is a diagram illustrating a structure of the memory device 100 of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells.

In an embodiment, the plurality of memory cells may be nonvolatile memory cells. Among the plurality of memory cells, memory cells coupled to the same word line may be defined as one page. That is, the memory cell array 110 may include a plurality of pages. In an embodiment, each of the plurality of memory blocks BLK1 to BLKz in the memory cell array 110 may include a plurality of dummy cells. One or more dummy cells may be coupled in series between a drain select transistor and the memory cells and between a source select transistor and the memory cells.

Each of the memory cells of the memory device 100 may be a single level cell (SLC) for storing one data bit, a multi-level cell (MLC) for storing two data bits, a triple level cell (TLC) for storing three data bits, or a quad level cell (QLC) for storing four data bits.

The peripheral circuit 120 may include the address decoder 121, a voltage generator 122, the read/write circuit 123, and a data input/output circuit 124.

The peripheral circuit 120 drives the memory cell array 110. For example, the peripheral circuit 120 may driver the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line WL of the selected memory block by applying voltages provided from the voltage generator 122 to the word line WL according to the decoded row address.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line, and apply a pass voltage higher than the read voltage to the unselected word lines.

In an embodiment, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In an embodiment, the address decoder 121 may decode a column address in the address ADDR transmitted thereto. The Decoded Column Address (DCA) may be transmitted to the read/write circuit 123. As an example, the address decoder 121 may include components such as a row decoder, a column decoder, and an address buffer.

The voltage generator 122 may generate a plurality of voltages by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage. The voltage generator 122 may be configured to generate various voltages required by the memory device 100. For example, the voltage generator 122 may generate a plurality of program voltages, a plurality of pass voltages, a plurality of select read voltages or a plurality of unselect read voltages.

For example, the voltage generator 122 may include a plurality of pumping capacitors for receiving the Internal power voltage, and generate a plurality of voltages by selectively activating the plurality of pumping capacitors under the control of the control logic 130.

The plurality of generated voltages may be supplied to the memory cell array 110 by the address decoder 121.

The read/write circuit 123 includes first to mth page buffers PB1 to PBm, which are coupled to the memory cell array 110 through the respective first to mth bit lines BL1 to BLm. The page buffers PB1 to PBm operate under the control of the control logic 130.

The first to mth page buffers PB1 to PBm communicate data with the data input/output circuit 124. In a program operation, the page buffers PB1 to PBm receive data DATA to be stored through the data input/output circuit 124 and data lines DL.

In a program operation, when a program pulse is applied to a selected word line, the first to mth page buffers PB1 to PBm may transfer data DATA received through the data input/output circuit 124 to selected memory cells through the bit lines BL1 to BLm. Memory cells of a selected page are programmed according to the transferred data DATA. A memory cell coupled to a bit line to which a program allow voltage (e.g., a ground voltage) is applied may have an increased threshold voltage. The threshold voltage of a memory cell coupled to a bit line to which a program inhibit voltage (e.g., a power voltage) is applied may be maintained. In a program verify operation, the first to mth page buffers PB1 to PBm read page data from the selected memory cells through the bit lines BL1 to BLm.

In a read operation, the read/write circuit 123 reads data DATA from the memory cells of the selected page through the bit lines BL, and outputs the read data DATA to the data input/output circuit 124.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data. In a program operation, the data input/output circuit 124 may receive data DATA to be stored from an external controller (not shown). In a read operation, the data input/output circuit 124 outputs, to the external controller, data transmitted from the first to m-th page buffers PB1 to PBm in the read/write circuit 123.

The control logic 130 may be coupled to the address decoder 121, the voltage generator 122, the read/write circuit 123, and the data input/output circuit 124. The control logic 130 may be configured to control overall operations of the memory device 100. The control logic 130 may operate in response to a command CMD transmitted from an external device.

In an embodiment, the control logic 130 may further include the sub-block setting component 131 as described with reference to FIG. 1.

The sub-block setting component 131 may set a size of a sub-block. The sub-block setting component 131 may be implemented with a register. In an embodiment, the sub-block setting component 131 may be implemented with an SRAM. The memory device 100 may set a size of the sub-block according to a value stored in the sub-block setting component 131.

In an embodiment, the memory device 100 may set feature data of the sub-block setting component 131 in response to a set feature command provided from the memory controller 200. A method for setting a size of a sub-block in a main block according to feature data will be described in more detail later with reference to FIGS. 10 and 11.

Figure 3:
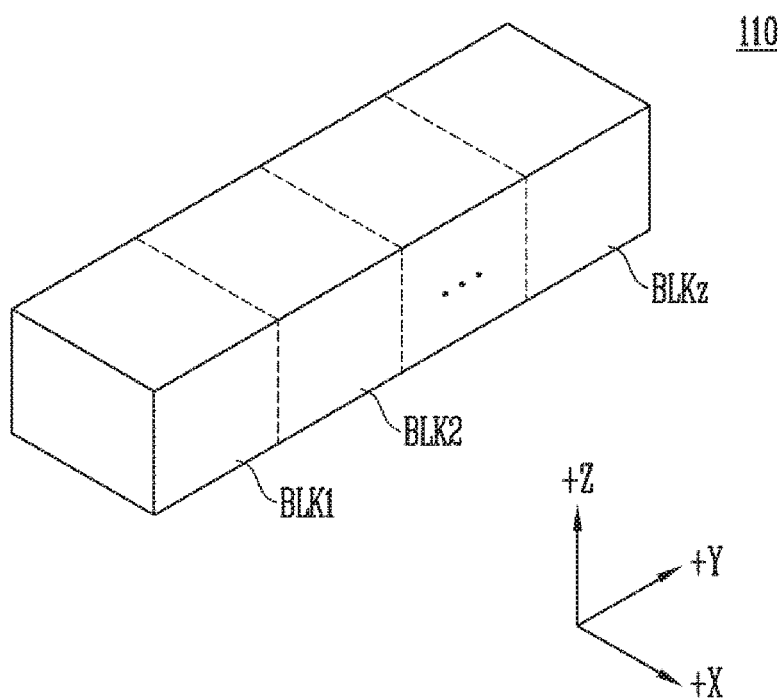
FIG. 3 is a diagram illustrating a memory cell array of FIG. 2 according to an embodiment of the present disclosure.

FIG. 3 is a diagram illustrating an embodiment of the memory cell array of FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
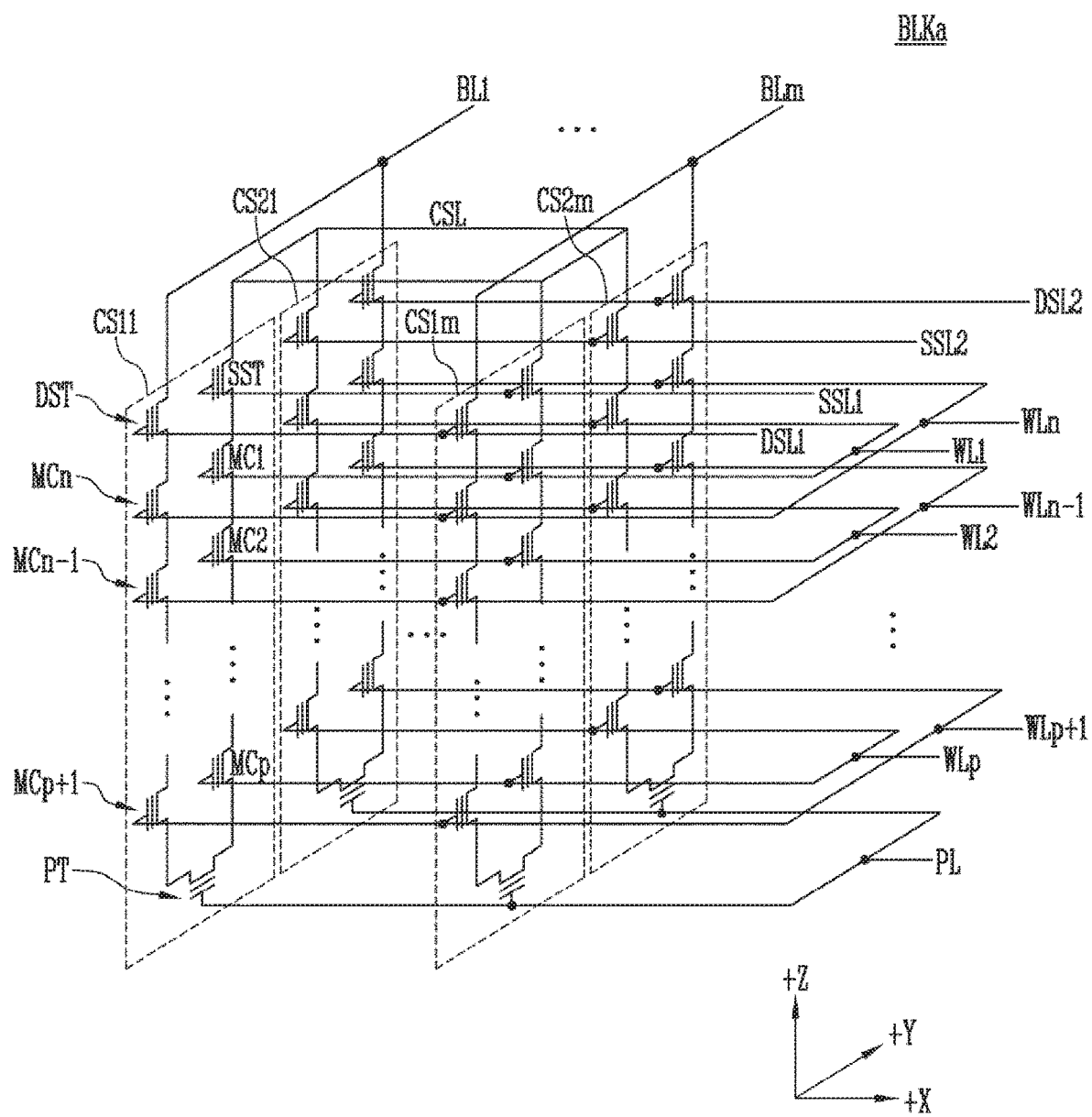
FIG. 4 is a circuit diagram illustrating any one memory block of FIG. 3 according to an embodiment of the present disclosure.

FIG. 4 is a circuit diagram illustrating any one memory block BLKa among the memory blocks BLK1 to BLKz of FIG. 3.

Referring to FIG. 4, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). Although FIG. 4 illustrates two cell strings arranged in a column direction (i.e., a +Y direction), the present disclosure is not limited thereto. That is, the two string arrangement shown in FIG. 4 is for clarity of illustration; it will be understood that three or more cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa is increased. When the number of dummy memory cells increases, the size of the memory block BLKa is decreased. On the other hand, the reliability of an operation of the memory block BLKa may be deteriorated.

In order to efficiently control the dummy memory cell(s), such cell(s) may have a required threshold voltage. Before or after an erase operation of the memory block BLKa, a program operation may be performed on all or some of the dummy memory cells. When an erase operation is performed after the program operation is performed, the threshold voltage of the dummy memory cell(s) control a voltage applied to the dummy word line(s) coupled to the respective dummy memory cell(s), so that the dummy memory cell(s) can have the required threshold voltage.

Figure 5:
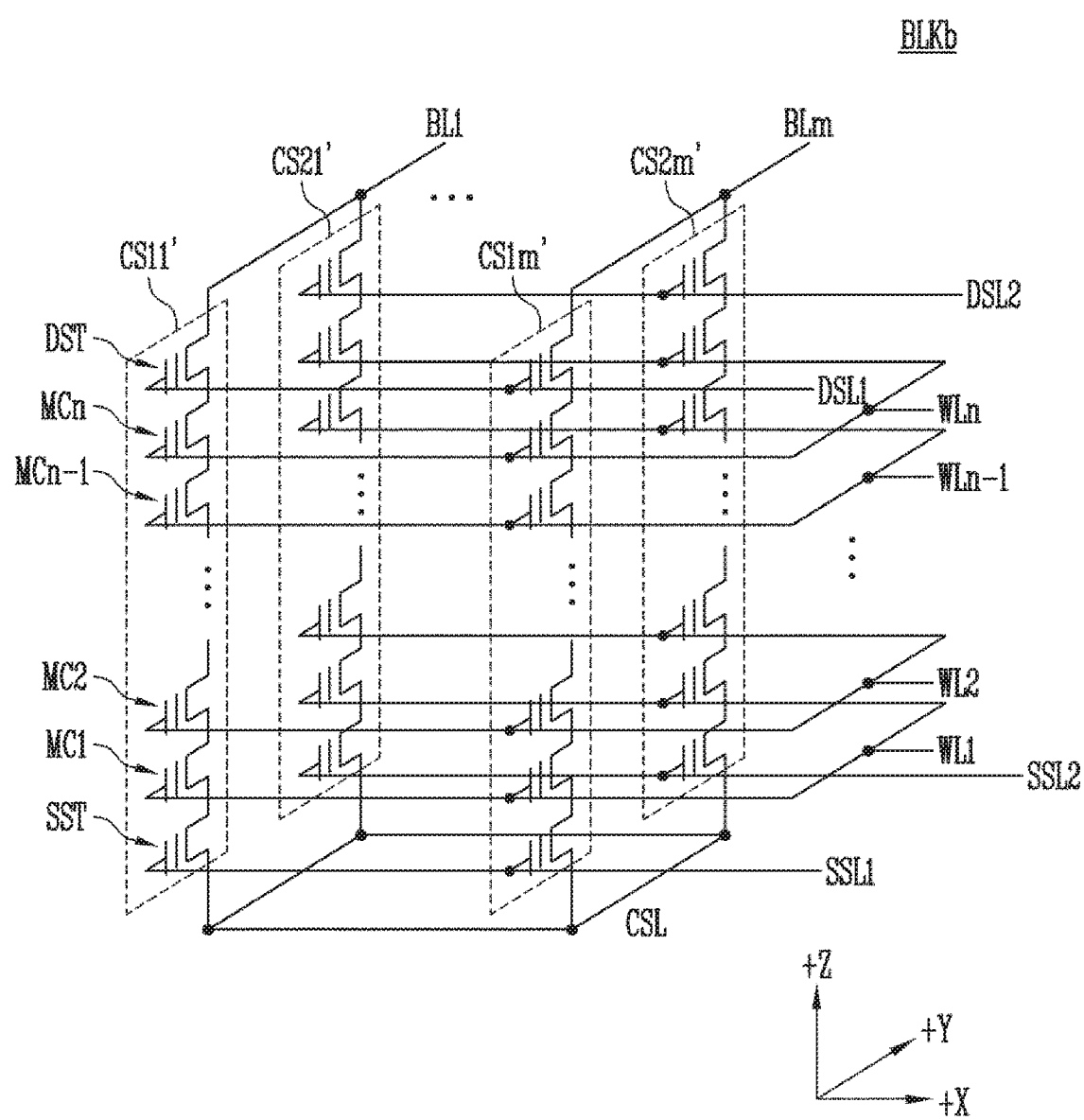
FIG. 5 is a circuit diagram illustrating another embodiment of a memory block of FIG. 3.

FIG. 5 is a circuit diagram illustrating another embodiment of a memory block, e.g., memory block BLKb, among the memory blocks BLK1 to BLKz of FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells is decreased, the size of the memory block BLKb is decreased. On the other hand, the reliability of an operation of the memory block BLKb may be deteriorated.

In order to efficiently control the dummy memory cell(s), such cell(s) may have a required threshold voltage. Before or after an erase operation of the memory block BLKb, a program operation may be performed on all or some of the dummy memory cells. When an erase operation is performed after the program operation is performed, the threshold voltage of the dummy memory cell(s) control a voltage applied to the dummy word line(s) coupled to the respective dummy memory cell(s), so that the dummy memory cell(s) can have the required threshold voltage.

Figure 6:
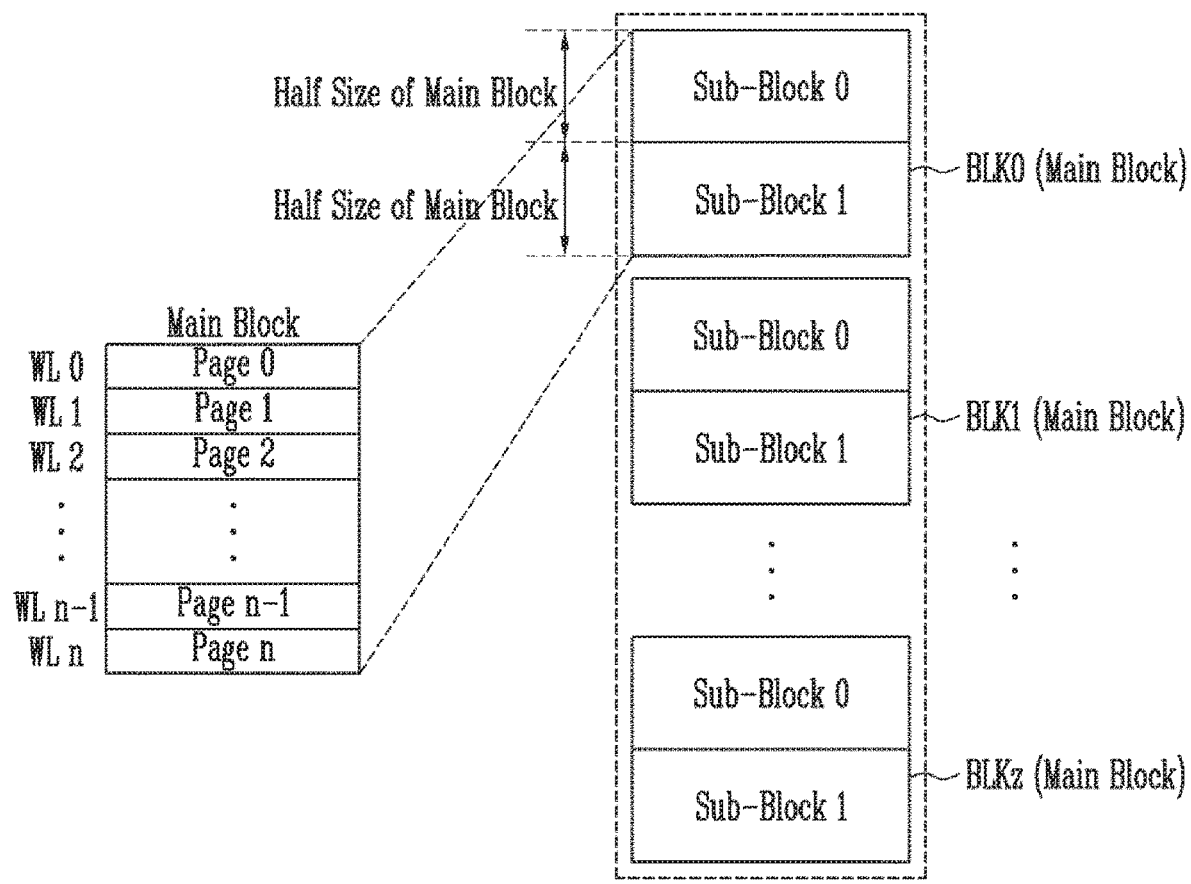
FIG. 6 is a diagram illustrating a set sub-block according to an embodiment of the present disclosure.

FIG. 6 is a diagram illustrating a set sub-block according to an embodiment of the present disclosure.

Referring to FIG. 6, a memory cell array 110a may include main blocks BLK0 to BLKz. The main block may be a unit for performing a normal erase operation.

In an embodiment, the main block may include zeroth to nth pages Page 0 to Page n. Each page may be configured with memory cells coupled to one word line. For example, memory cells coupled to a zeroth word line may constitute the zeroth page, and memory cells coupled to a first word line may constitute the first page.

In the embodiment of FIG. 6, one main block may be divided into two sub-blocks. Specifically, each of the main blocks BLK0 to BLKz may include a zeroth sub-block sub-block 0 and a first sub-block sub-block 1.

In an embodiment, one sub-block may be about half of the size of the main block. For example, the zeroth sub-block may include pages corresponding to half of the zeroth to nth pages. The first sub-block may include pages corresponding to the other half of the zeroth to nth pages.

When a normal erase operation is performed on one main block, data stored in the main block may all be erased.

However, when a partial block erase operation is performed on a sub-block in a single main block, only data stored in the sub-block, among data stored in the main block, may be erased. For example, when a partial block erase operation is performed on the zeroth sub-block, data stored in the zeroth sub-block may be erased. However, data stored in the first sub-block may be still maintained.

Figure 7:
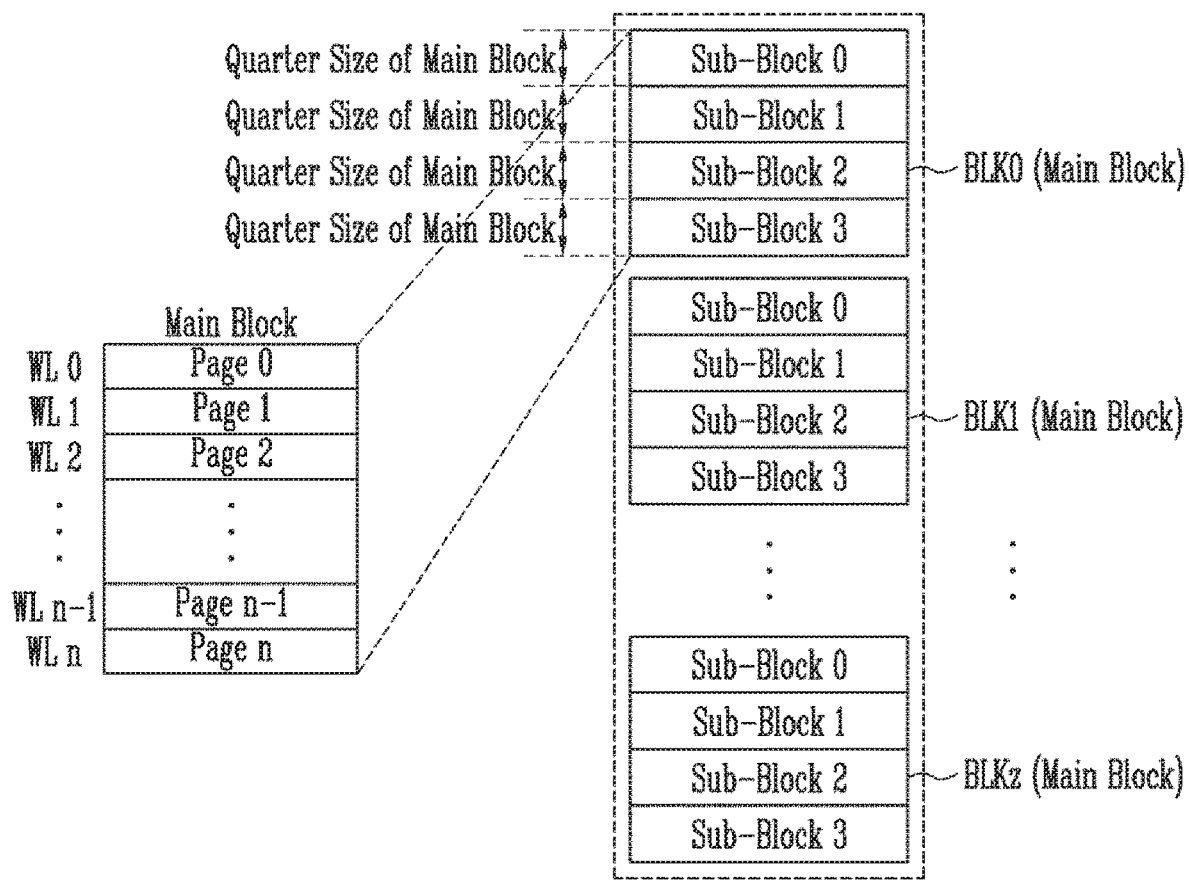
FIG. 7 is a diagram illustrating a set sub-block according to another embodiment of the present disclosure.

FIG. 7 is a diagram illustrating a set sub-block according to another embodiment of the present disclosure.

Referring to FIG. 7, a memory cell array 110b may include main blocks BLK0 to BLKz. The main block may be a unit for performing a normal erase operation.

In an embodiment, the main block may include zeroth to nth pages Page 0 to Page n. Each page may be configured with memory cells coupled to one word line. For example, memory cells coupled to a zeroth word line may constitute the zeroth page, and memory cells coupled to a first word line may constitute the first page.

In the embodiment of FIG. 7, one main block may be divided into four sub-blocks. Specifically, each of the main blocks BLK0 to BLKz may include zeroth to third sub-blocks sub-block 0 to sub-block 3.

In an embodiment, one sub-block may correspond to about ¼ of the size of the main block. For example, the zeroth sub-block may include pages corresponding to ¼ of the zeroth to nth pages Page 0 to Page n. The first sub-block may include pages corresponding to another ¼ of the zeroth to nth pages Page 0 to Page n.

When a normal erase operation is performed on one main block, data stored in the main block may all be erased.

However, when a partial block erase operation is performed on a sub-block in a single main block, only data stored in the corresponding sub-block, among data stored in the main block, may be erased. For example, when a partial block erase operation is performed on the zeroth sub-block, data stored in the zeroth sub-block may be erased. However, data stored in the first to third sub-blocks that are the other sub-blocks may be still maintained.

Figure 8:
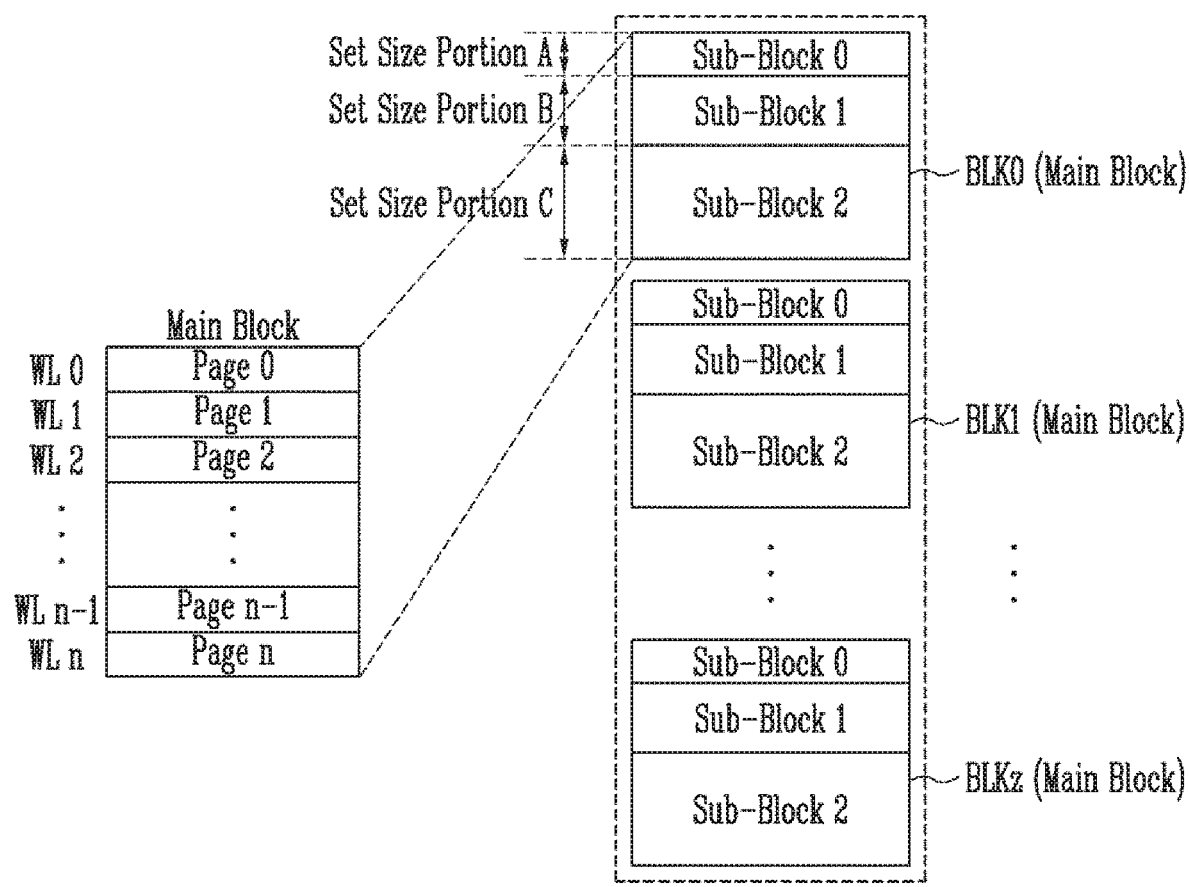
FIG. 8 is a diagram illustrating a set sub-block according to another embodiment of the present disclosure.

FIG. 8 is a diagram illustrating a set sub-block according to another embodiment of the present disclosure.

Referring to FIG. 8, a memory cell array 110c may include main blocks BLK0 to BLKz. The main block may be a unit for performing a normal erase operation.

In an embodiment, the main block may include zeroth to nth pages Page 0 to Page n. Each page may be configured with memory cells coupled to one word line. For example, memory cells coupled to a zeroth word line may constitute the zeroth page, and memory cells coupled to a first word line may constitute the first page.

In the embodiment of FIG. 8, one main block may be divided into three sub-blocks. Specifically, each of the main blocks BLK0 to BLKz may include zeroth to second sub-blocks sub-block 0 to sub-block 2.

In the embodiment of FIG. 8, the zeroth to second sub-blocks sub-block 0 to sub-block 2 may have different sizes (Set Size Portion A, B, C). That is, the zeroth sub-block sub-block 0, the first sub-block sub-block 1, and the second sub-block sub-block 2 may have different storage capacities. Therefore, numbers of pages in the zeroth sub-block sub-block 0, the first sub-block sub-block 1, and the second sub-block sub-block 2 may also be different.

When a normal erase operation is performed on one main block, data stored in the main block may all be erased.

However, when a partial block erase operation is performed on a sub-block in a single main block, only data stored in the corresponding sub-block, among data stored in the main block, may be erased. For example, when a partial block erase operation is performed on the zeroth sub-block, data stored in the zeroth sub-block may be erased. However, data stored in the first and second sub-blocks that are the other sub-blocks may be still maintained. Since the sub-blocks have different sizes, the number of actually erased pages may be different, depending on which sub-block a partial block erase operation is performed.

Figures 9, 10:
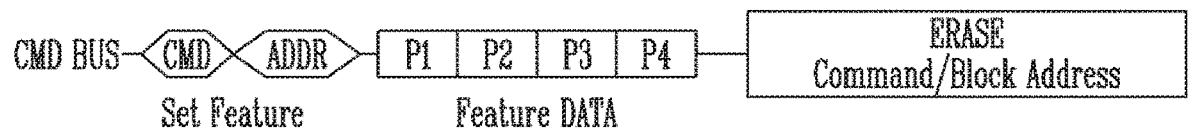
FIG. 9 is a diagram illustrating a voltage applied in a partial block erase operation of erasing only a portion of a memory block according to an embodiment of the present disclosure.
FIG. 10 is a diagram illustrating a control signal that a memory controller provides to the memory device to set a sub-block according to an embodiment of the present disclosure.

FIG. 9 is a diagram illustrating a voltage applied in a partial block erase operation of erasing only a portion of a memory block.

Referring to FIG. 9, the partial block erase operation may be divided into a section (Erase) for applying an erase voltage and a section (HEV) for verifying an erase operation. The partial block erase operation may erase at least one selected sub-block among a plurality of sub-blocks in one main block. Unselected sub-blocks are not erased by the partial block erase operation.

In the section (Erase) for applying the erase voltage, an erase voltage Vers may be applied to a substrate in the partial block erase operation. Memory cells are provided along rows and columns on the substrate, and may be stacked in a direction Intersecting the substrate to be formed in a three-dimensional structure.

A ground voltage (0V) may be applied to the selected sub-blocks. For example, a voltage of 0V may be applied to word lines corresponding to the selected sub-blocks. The unselected sub-blocks are floated. For example, word lines corresponding to the unselected sub-blocks may be floated.

In the section (HEV) for verifying the erase operation, an erase verify voltage HEV may be applied to the selected sub-blocks. For example, the erase verify voltage may be applied to the word lines corresponding to the selected sub-blocks. When the erase verify voltage is applied, memory cells coupled to the word lines corresponding to the selected sub-blocks may be in a turn-on or turn-off state. A pass voltage Vpass_r may be applied to the unselected sub-blocks. For example, the pass voltage Vpass_r is applied to the word lines corresponding to the unselected sub-blocks.

The partial block erase operation may be performed by repeating the section (Erase) for apply the erase voltage and the section (HEV) for verifying the erase operation. The partial block erase operation may be performed until all the memory cells coupled to the word lines corresponding to the selected sub-blocks are in the turn-on state in the section (HEV) for verifying the erase operation. Whenever the section (Erase) for applying the erase voltage and the section (HEV) for verifying the erase operation are repeated, the erase voltage Vers applied to the substrate may increase.

Under the above-described condition, when the partial block erase operation is performed, data stored in pages in the selected sub-blocks may be erased, and data stored in pages in the unselected sub-blocks may be maintained.

FIGS. 10 and 11 are diagrams illustrating a method for setting a size of a sub-block according to an embodiment of the present disclosure.

FIG. 10 is a diagram Illustrating a control signal that the memory controller provides to the memory device to set a sub-block.

Referring to FIG. 10, the memory controller may set or change data stored in a sub-block setting component in the memory device, using a feature set command (Set Feature). For example, the sub-block setting component may be a register in the memory device. The feature set command (Set Feature) may be a command for changing or setting a value of a register corresponding to a feature address (Feature Address).

The memory device sets a size of a sub-block, based on a value stored in a register corresponding to the sub-block setting component. Hence, the size of a sub-block in a main block may be changed in response to the feature set command.

Specifically, the memory controller may sequentially provide the memory device with a feature set command, a feature address indicating an address of a register to be set or changed, and feature data (Feature DATA) that is data to be set or changed.

The memory device may decode an input command, and identify that the corresponding command is the feature set command. The memory device may set a value of a register corresponding to a continuously input feature address to feature data.

The memory device may set a size of a sub-block according to the set value of the register.

Subsequently, the memory controller may provide an erase command and an address (denoted by "ERASE Command/Block Address" in FIG. 10) to the memory device such that the memory device performs a partial block erase operation or a normal erase operation. When an erase command and a block address corresponding to the partial block erase operation are input, the memory device may perform an erase operation on a corresponding sub-block.

Thus, the memory controller sets an area to be erased to one sub-block, using the feature set command Set Feature and then provides a partial block erase command for the sub-block, so that only a specific area, e.g., the sub-block can be selectively erased.

Figures 11A, 11B:
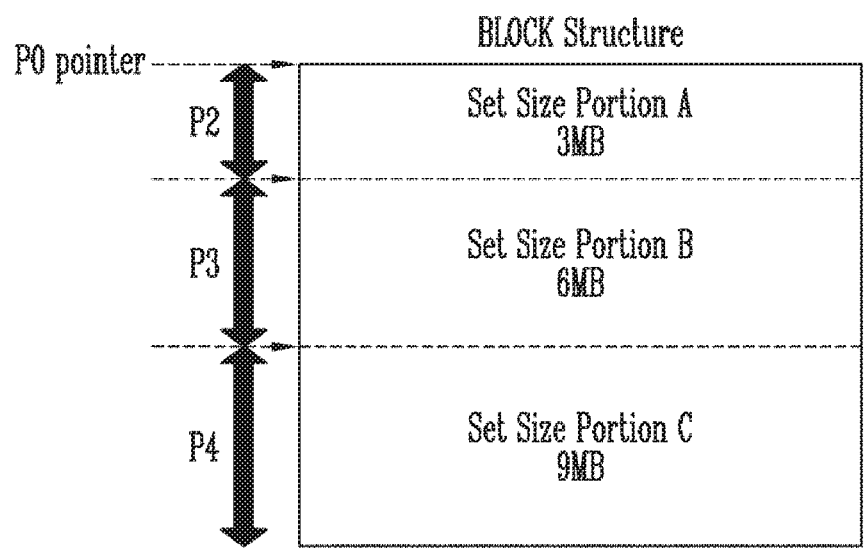
FIG. 11A is a diagram illustrating data stored in the sub-block setting component, which may be a register, in the memory device.
FIG. 11B is a diagram illustrating a structure of a sub-block set according to feature data (Feature DATA).

FIG. 11A and FIG. 11B Illustrate a main block including sub-blocks set in response to the control signal of FIG. 10.

FIG. 11A is a diagram illustrating data stored in the sub-block setting component, which may be a register, in the memory device. FIG. 11B is a diagram illustrating a structure of a sub-block set according to feature data (Feature DATA).

Referring to FIG. 11A and FIG. 11B, the feature data received, along with the feature set command (Set Feature), from the memory controller may include P1 to P4 data.

The P1 to P4 data may be sub-feature parameter values (Sub feature parameters 1 to 4) that represent a feature parameter value stored in the sub-block setting component 131.

Specifically, the P1 data may be a value representing a start point for setting a sub-block. For example, the P1 data may be a page number corresponding to a start point of a sub-block among a plurality of pages in the main block.

The P2 to P4 data may be values for determining boundary points between the respective sub-blocks.

For example, the P2 data may represent a number of pages in a zeroth sub-block (Sub-Block 0) that is a first sub-block including, as a first page, a page corresponding to the P1 data. The P2 data may represent a number of pages in a first sub-block (Sub-Block 1) that is a second sub-block located immediately after the last page of the zeroth sub-block (Sub-Block 0). The P3 data may represent a number of pages in a second sub-block (Sub_Block 2) that is a third sub-block located immediately after the last page of the first sub-block (Sub-Block 1).

Figure 12:
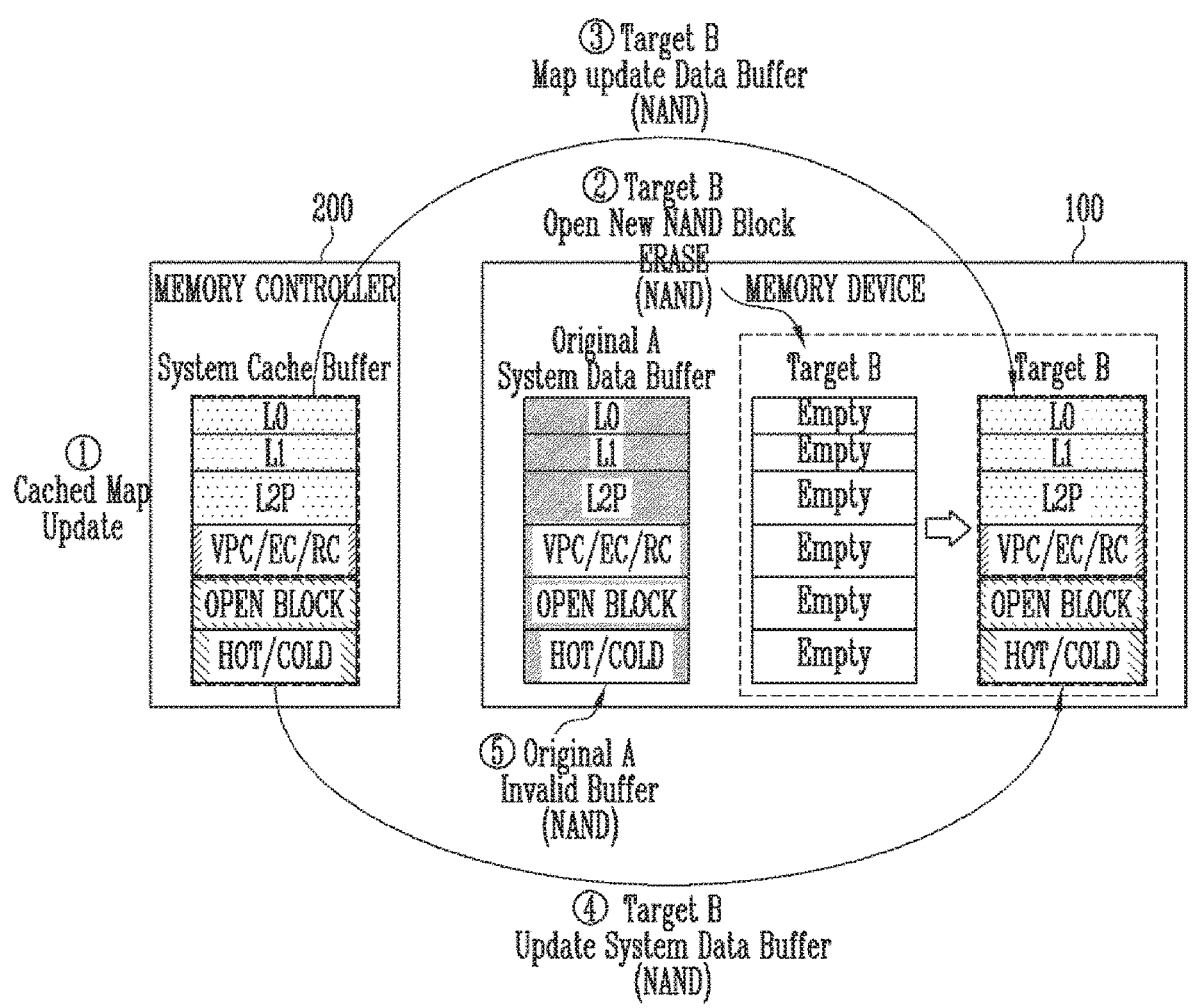
FIG. 12 is a diagram illustrating an update process of a system block according to a conventional method.

FIG. 12 is a diagram illustrating an update process of a system block according to a conventional method.

Referring to FIG. 12, the memory controller 200 may include a system cache buffer. Data stored in the system cache buffer may be updated by moving them into a system data buffer in the memory device 100 periodically or under the control of the memory controller 200. In an embodiment, the system cache buffer may be an SRAM or DRAM. A process of updating a system block that is a memory block in which system information is stored will be described in more detail.

Step ①: Data corresponding to mapping information L0, L1, and L2P, a Valid Page Count (VPC), an Erase Count (EC), and a Read Count (RC), which are stored in the system cache buffer, is updated.

Step ②: Block Target B that is a new block is erased such that system data is stored in the block Target B. In a NAND flash memory, data cannot be again stored in a memory block in which data has already been stored. Therefore, system data cannot be newly stored in block Original A that is a system block in which the system data was previously stored. The memory controller 200 is to open a new block among the memory blocks in the memory device 100 and store the system data in the opened new block. Therefore, the block Target B that is the new block is erased.

Step ③: The memory controller 200 stores, in the block Target B, the data corresponding to the mapping information L0, L1, and L2P, the Valid Page Count (VPC), the Erase Count (EC), and the Read Count (RC), which are stored in the system cache buffer.

Step ④: The memory controller 200 may store, in the block Target B, open block information and hot/cold information, which are stored in the system cache buffer.

Step ⑤: The memory controller 200 processes the block Original A to be invalid.

Accordingly, when the system block is updated through the steps ① to ⑤, the block Target B that is the new memory block is to be used. Therefore, one open block is to be used. In addition, a data input/program time for storing the open block information and the hot/cold information, which are not changed, occurs.

Figure 13:
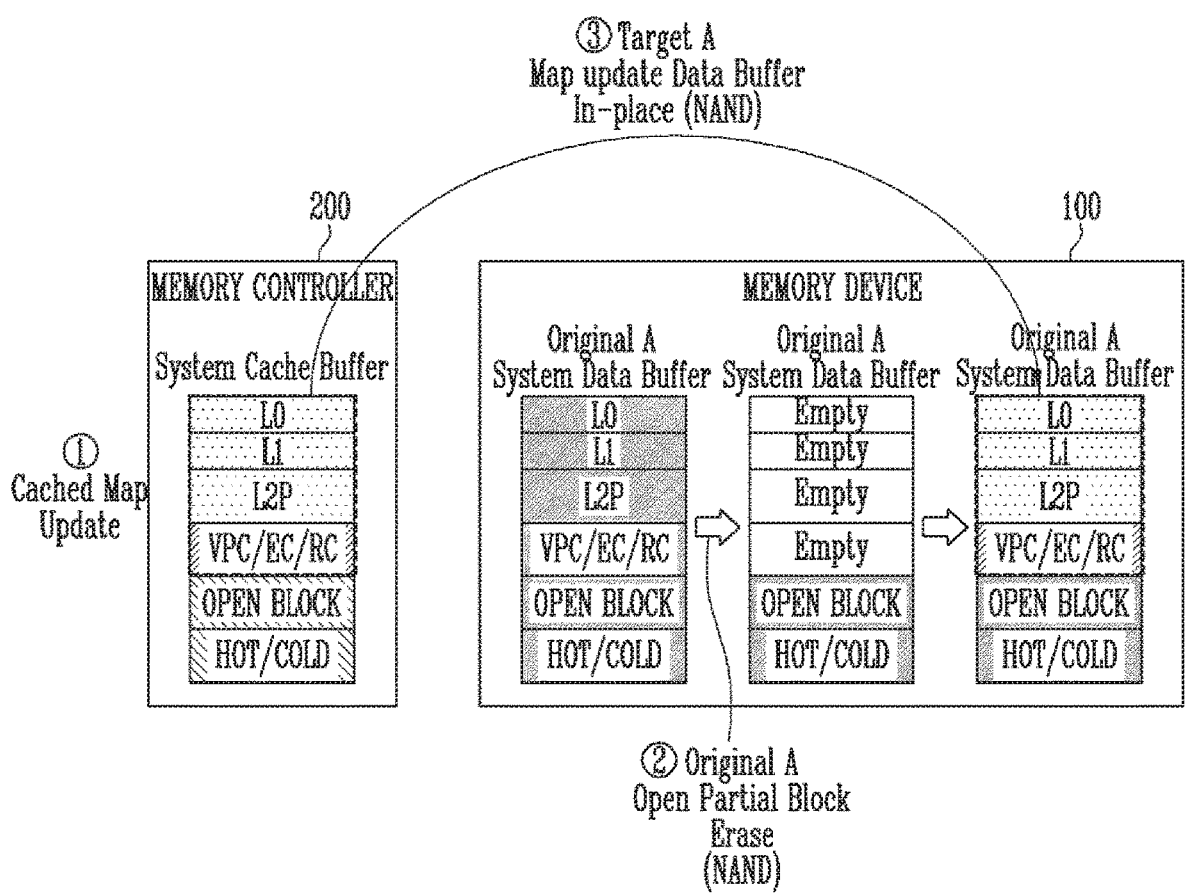
FIG. 13 is a diagram illustrating an update process of a system block according to an embodiment of the present disclosure.

FIG. 13 is a diagram illustrating an update process of a system block according to an embodiment of the present disclosure.

Referring to FIG. 13, the memory controller 200 may include a system cache buffer. Data stored in the system cache buffer may be updated by moving the data into a system data buffer in the memory device 100 periodically or under the control of the memory controller 200. In an embodiment, the system cache buffer may be an SRAM or DRAM. A process of updating a system block that is a memory block in which system information is stored will be described in more detail.

Step ①: Data corresponding to mapping information L0, L1, and L2P, a Valid Page Count (VPC), an Erase Count (EC), and a Read Count (RC), which are stored in the system cache buffer, is updated.

Step ②: A partial block erase operation is performed on an area to be updated among areas in block Original A. That is, according to an embodiment of the present disclosure, a memory block may be erased in units of sub-blocks. That is, only a portion of the block Original A may be erased. Therefore, a new open block is not used, and the block Original A that is the existing system data buffer block may be used.

Step ③: The memory controller 200 stores, in the erased area of the block Original A, the data corresponding to the mapping information L0, L1, and L2P, the Valid Page Count (VPC), the Erase Count (EC), and the Read Count (RC), which are stored in the system cache buffer.

Thus, as compared with the technique of FIG. 12, any new block is not used, and any data input/program time for storing open block information and hot/cold information, which are not changed, does not occur.

FIG. 14 is a diagram illustrating a use state of a system block according to an embodiment of the present disclosure.

When each area of "firmware FW" and "check point 1 C1" is allocated to the whole of a fixed single main block, it may be disadvantageous to secure an over-provisioning area required to maintain the performance of the storage device when the size of a memory block increases.

However, referring to FIG. 14, when a single memory block is divided into a plurality of sub-blocks (e.g., two sub-blocks) having different sizes, according to an embodiment of the present disclosure, the areas of the "firmware FW" and the "check point 1 C1" may be respectively allocated to the sub-blocks of the single memory block. The "firmware FW" and the "check point 1 C1" are areas in which only a read count increases, and therefore, it is less likely that an erase/write number will occur. Thus, when a single memory block is divided into a plurality of sub-blocks having different sizes to be used according to an embodiment of the present disclosure, the reliability of the storage device can be improved.

Figure 15:
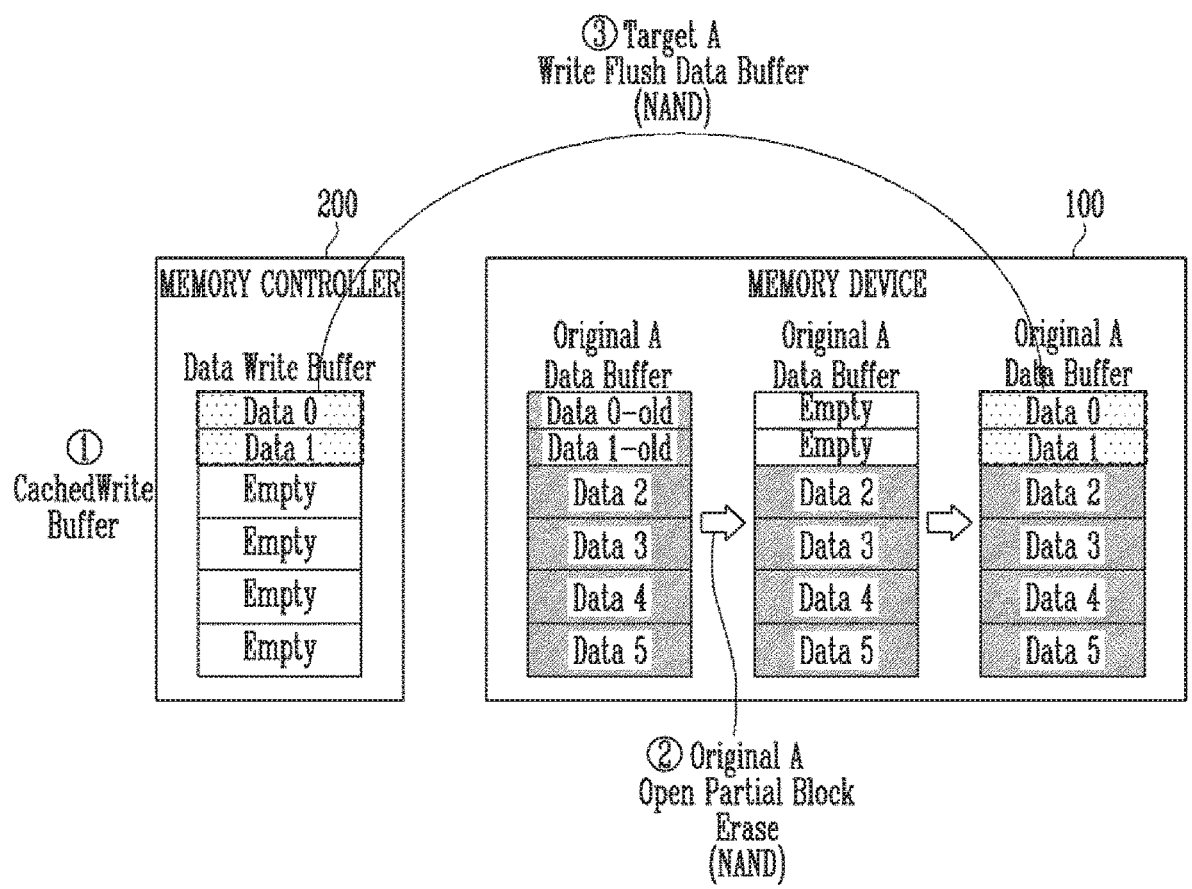
FIG. 15 is a diagram illustrating a flush operation of a write buffer according to an embodiment of the present disclosure.

FIG. 15 is a diagram illustrating a flush operation of a write buffer according to an embodiment of the present disclosure.

Referring to FIG. 15, the memory controller 200 may move data from a data write buffer into a data buffer in the memory device 100 in response to a flush command input from the host. In an embodiment, the data write buffer may be an SRAM or DRAM. A process of updating data stored in the data write buffer to the data buffer in the memory device 100 will be described in more detail.

Step ①: Data 0 and data 1 are input to the data write buffer (CachedWriteBuffer).

Step ②: A partial block erase operation is performed on an area to be updated, among areas in block Original A. That is, according to an embodiment of the present disclosure, a memory block may be erased in units of sub-blocks. That is, only a portion of the block Original A may be erased.

Therefore, a new open block is not used, and the block Original A that is the existing data buffer block may be used.

Step ③: The memory controller 200 stores the data 0 and the data 1, which are stored in the data write buffer, in the erased area of the block Original A.

Thus, according to an embodiment of the present disclosure, the memory controller 200 does not use a separate free block even when normal data in the data buffer from a cache buffer, like the system block. In addition, any data input/program time for storing data not to be updated does not occur.

Figure 16:
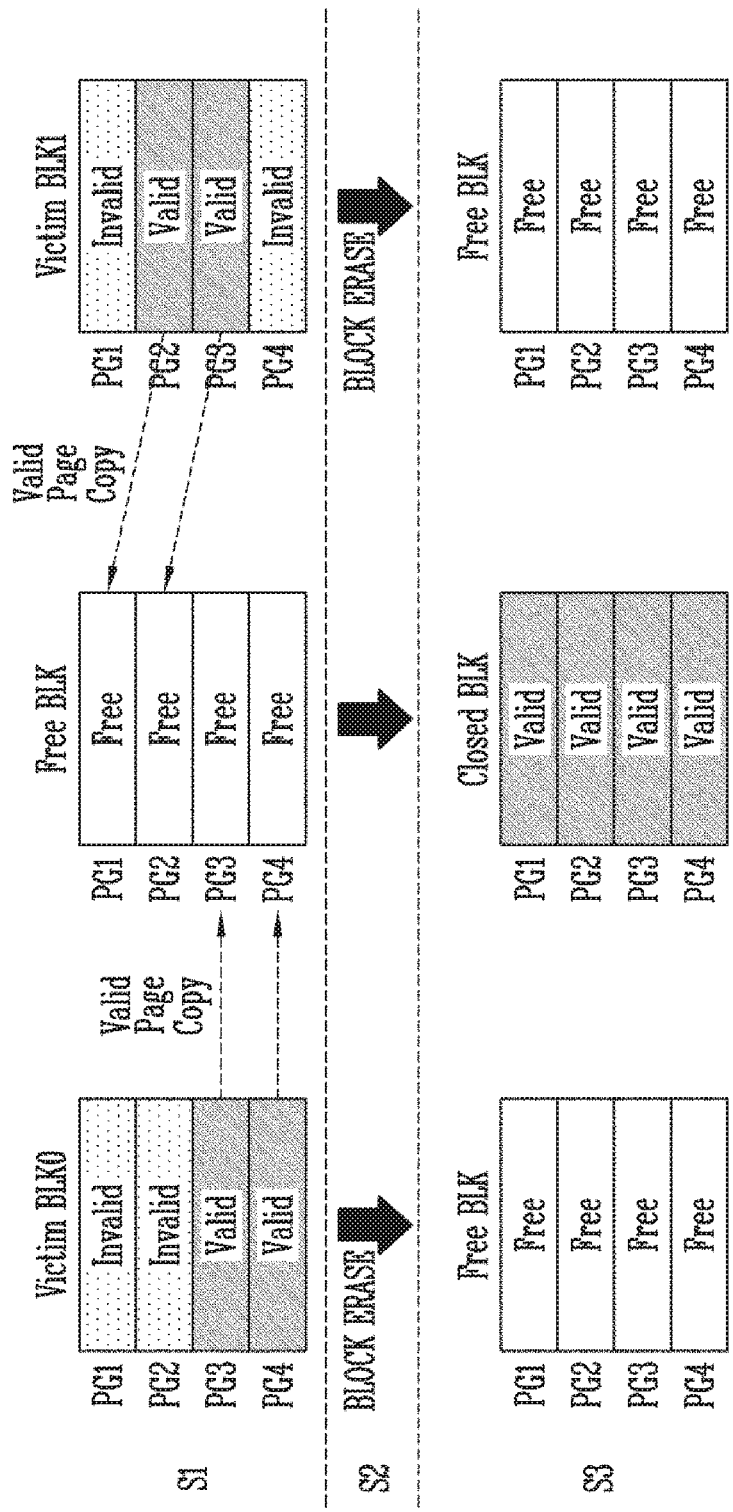
FIG. 16 is a diagram illustrating a garbage collection operation of the storage device according to an embodiment of the present disclosure.

FIG. 16 is a diagram illustrating a garbage collection operation of the storage device.

Referring to FIG. 16, the garbage collection operation may be an operation performed to secure a free block. The garbage collection operation may be an operation of copying valid data in victim blocks, also storing invalid data, to a free block and erasing the victim blocks to make them free blocks.

For clarity and ease of description, FIG. 16 illustrates that one memory block includes four pages, i.e., first to fourth pages PG1 to PG4, but the present disclosure is not limited thereto.

The garbage collection operation of FIG. 16 may be performed through steps S1 to S3.

In the step S1, block 0 (BLK0) and block 1 (BLK1) are selected as victim blocks (Victim BLK0 and Victim BLK1). A method for selecting victim blocks may be performed based on various references. For example, memory blocks in which the amount of valid data is a certain level or less may be selected as victim blocks. Alternatively, victim blocks may be selected using a ratio of valid data to invalid data.

First and second pages of block 0 (Victim BLK0) may be invalid pages in which invalid data are stored, and third and fourth pages of the block 0 (Victim BLK0) may be valid pages in which valid data are stored.

First and fourth pages of Victim BLK1 may be invalid pages in which invalid data are stored, and second and third pages of the Victim BLK1 may be valid pages in which valid data are stored.

The memory controller may copy data stored in valid pages of the Victim BLK0 and Victim BLK1 to a free block (Free BLK), which is a target block of the garbage collection operation. The copying process may be performed using a method of reading data stored in the valid pages of Victim BLK0 and Victim BLK1 and programming the read data in the Free BLK.

In the step S2, the memory controller may perform a normal erase operation on the Victim BLK0 and Victim BLK1. All data stored in the Victim BLK0 and Victim BLK1 may be erased through the erase operation.

In the step S3, the Victim BLK0 and Victim BLK1 may become free blocks, and the target block that was a free block may become an open block or a closed block.

Figure 17:
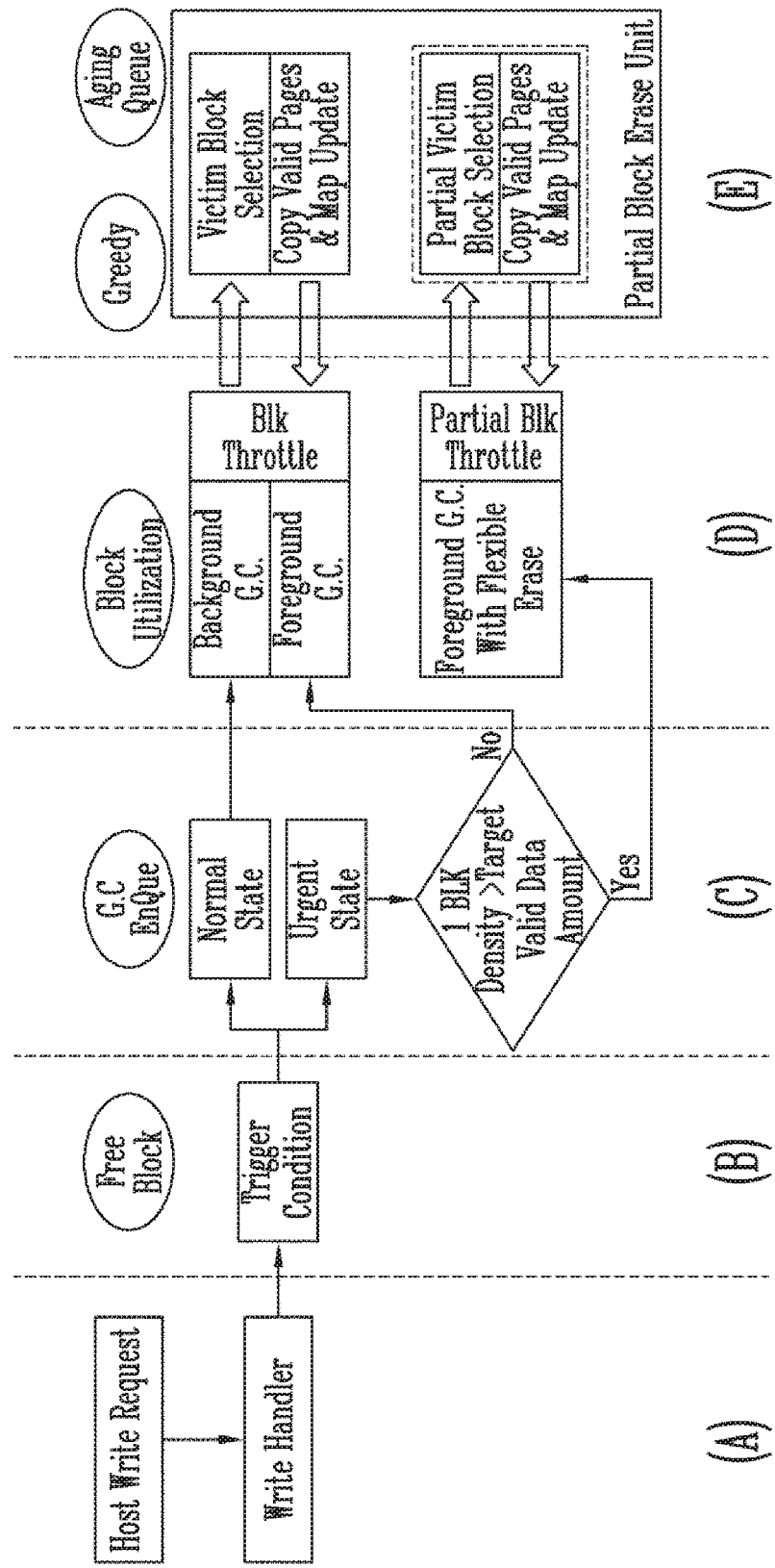
FIG. 17 is a diagram illustrating a garbage collection operation according to an embodiment of the present disclosure.

FIG. 17 is a diagram illustrating a garbage collection operation according to an embodiment of the present disclosure.

Referring to FIG. 17, in phase (A), when a write request is input from the host, the memory controller transfers the input write request to the write handler.

In phase (B), the memory controller may determine a triggering condition, which is related with the first and second reference values TH1 and TH2 as described with reference to FIG. 1, according to a number of currently free blocks in the memory device 100.

In phase (C), when the number of currently free blocks is sufficient, the memory controller determines that the triggering condition corresponds to a normal state. When the number of currently free blocks is not sufficient, the memory controller determines that the triggering condition corresponds to an urgent state. When the amount of valid data to be copied from victim blocks into a target block during a garbage collection is less than a storage capacity of a single memory block (i.e., the target block), a partial block erase operation may be performed in the garbage collection operation.

In phase (D), the memory controller performs the garbage collection operation as a background operation in the normal state, and performs the garbage collection operation as a foreground operation in the urgent state. In addition, when the amount of valid data is less than a storage capacity of a single memory block, a partial block erase operation may be performed in the garbage collection operation. In FIG. 17, the partial block erase operation is referred to as "Flexible Erase".

In phase (E), when the partial block erase operation is performed in the garbage collection operation, the memory controller may select some pages Partial Page (i.e., one or more sub-blocks) from a victim block, erase data stored in the selected sub-blocks, store valid data in the selected sub-blocks, and perform a map update. The garbage collection operation according to an embodiment of the present disclosure will be described in more detail below with reference to FIGS. 18 to 21.

Figure 18:
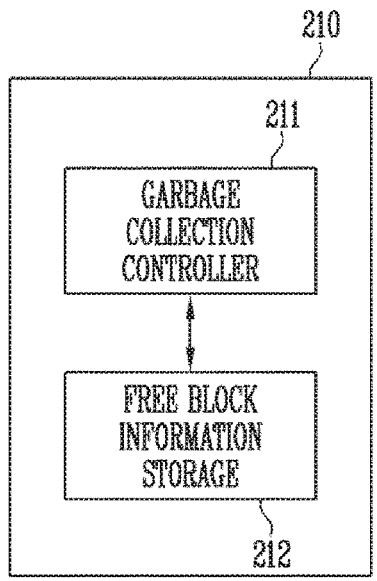
FIG. 18 is a block diagram illustrating a structure of a write handler of FIG. 1 according to an embodiment of the present disclosure.

FIG. 18 is a block diagram Illustrating a structure of the write handler 210 of FIG. 1.

Referring to FIG. 18, the write handler 210 may include a garbage collection controller 211 and a free block information storage 212.

The free block information storage 212 may store information on states of the memory blocks in the memory device. For example, the free block information storage 212 may store information indicating free, open, and closed states of the respective memory blocks of the memory device 100. The free block information storage 212 may store a number of free blocks among the memory blocks.

The garbage collection controller 211 may control a garbage collection operation of the memory device.

Specifically, the garbage collection controller 211 may determine whether the garbage collection operation is to be performed according to the number of free blocks, which is stored in the free block information storage 212. For example, when the number of free blocks exceeds a first reference value TH1, the garbage collection controller 211 may not perform the garbage collection operation.

When the number of free blocks is less than or equal to the first reference value TH1, the garbage collection controller 211 may perform the garbage collection operation.

In an embodiment, the garbage collection controller 211 may determine whether the garbage collection operation is to be performed as a background operation or foreground operation according to whether the number of free blocks exceeds a second reference value TH2. The background operation may be an operation performed while the memory device is in an idle state. The memory device may not perform another operation while the garbage collection operation is being performed as a foreground operation.

For example, when the number of free blocks exceeds the second reference value TH2, the garbage collection controller 211 may perform the garbage collection operation as a background operation. When the number of free blocks is less than or equal to the second reference value TH2, it is urgent to secure a free block, and hence the garbage collection operation may be performed as a foreground operation.

In an embodiment, the garbage collection controller 211 may select, as a victim block, at least one closed memory block among the memory blocks.

The garbage collection controller 211 may secure a free block by copying valid data in at least one victim block to the free block and erasing the victim blocks.

In an embodiment, when the garbage collection operation is performed as a foreground operation, the garbage collection controller 211 may determine whether the amount of valid data in the victim blocks exceeds the storage capacity of one main block.

When the amount of valid data in the victim blocks exceeds the storage capacity of one main block, the garbage collection controller 211 may perform the garbage collection operation using a normal erase operation.

When the amount of valid data in the victim blocks does not exceed the storage capacity of one main block, the garbage collection controller 211 may perform the garbage collection operation using a partial block erase operation.

Specifically, the garbage collection controller 211 may select a target block in which the valid data in the victim blocks are to be stored. The target block may be a closed block having an amount of invalid data that is larger than the amount of valid data in the victim blocks.

The garbage collection controller 211 may set invalid pages in which the invalid data of the target block are stored to at least one sub-block according to the operation of setting sub-blocks, which is described in FIGS. 10 and 11.

The garbage collection controller 211 may selectively erase at least one sub-block in the target block using a partial block erase operation.

The garbage collection controller 211 may copy the valid data in the victim blocks to the erased sub-block.

The garbage collection controller 211 may secure free blocks by erasing the victim blocks.

Figure 19:
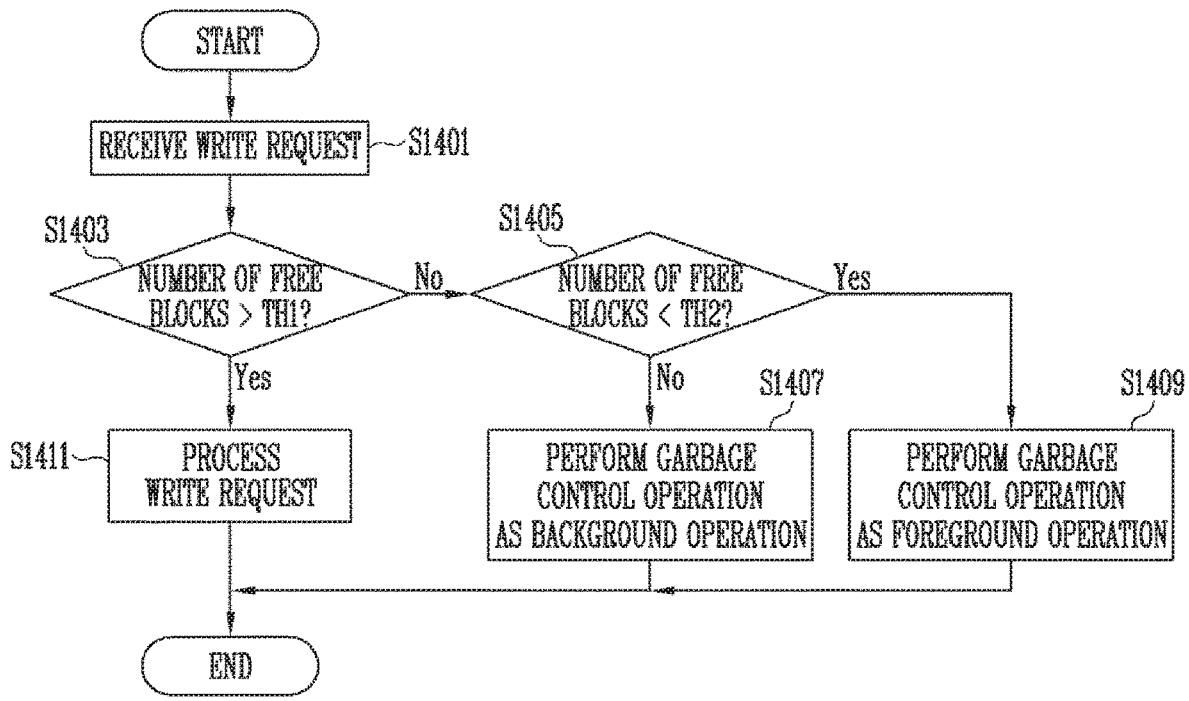
FIG. 19 is a flowchart illustrating an operating method of the storage device according to an embodiment of the present disclosure.

FIG. 19 is a flowchart illustrating an operating method of the storage device according to an embodiment of the present disclosure.

Referring to FIG. 19, in step S1401, a storage device, e.g., storage device 50, may receive a write request from the host.

In step S1403, the storage device may determine whether the number of free blocks is less than or equal to a first reference value TH1. When it is determined that the number of free blocks is greater than the first reference value TH1, the storage device proceeds to step S1411. When it is determined that the number of free blocks is less than or equal to the first reference value TH1, the storage device proceeds to step S1405.

In the step S1405, the storage device may determine whether the number of free blocks is less than or equal to a second reference value TH2. When it is determined that the number of free blocks is greater than the second reference value TH2, the storage device proceeds to S1407. When it is determined that the number of free blocks is smaller than or equal to the second reference value TH2, the storage device proceeds to S1409.

In the step S1407, the storage device may perform a garbage control operation as a background operation. The method of performing, by the storage device, the garbage control operation as the background operation will be described in more detail later with reference to FIG. 20.

In the step S1409, the storage device may perform the garbage control operation as a foreground operation. The method of performing, by the storage device, the garbage control operation as the foreground operation will be described in more detail later with reference to FIG. 21.

In the step S1411, the storage device may process the write request. Specifically, the storage device may store write data corresponding to the write request in a free block.

Figure 20:
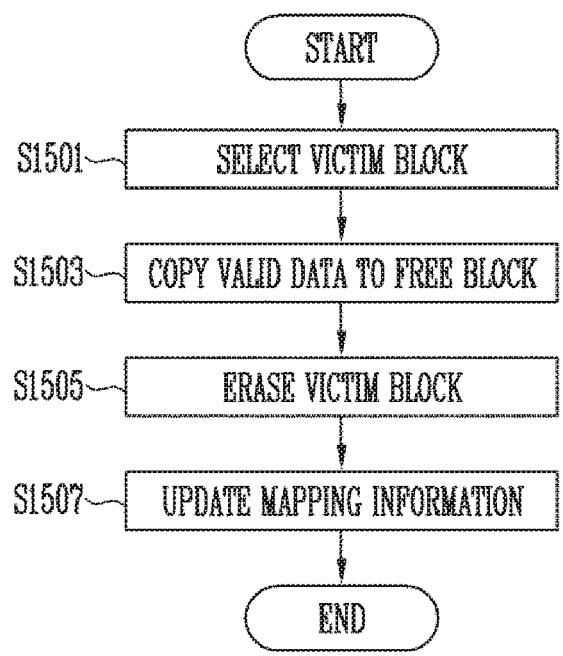
FIG. 20 is a flowchart illustrating an operating method of the storage device according to another embodiment of the present disclosure.

FIG. 20 is a flowchart illustrating an operating method of the storage device according to another embodiment of the present disclosure.

FIG. 20 is a diagram illustrating the garbage control operation performed as a background operation, which described in FIG. 19.

Referring to FIG. 20, in step S1501, a storage device, e.g., storage device 50, may select victim blocks. Specifically, the storage device may select, as a victim block, at least one closed memory block among closed memory blocks. The method of selecting the victim block may be performed based on various references. For example, memory blocks in which the amount of valid data is a certain level or less may be selected as victim blocks. Alternatively, victim blocks may be selected using a ratio of valid data to invalid data.

In step S1503, the storage device may copy valid data to a free block. Specifically, the storage device may read valid pages in which valid data in at least one victim block are stored, and program the read valid data to the free block.

In step S1505, the storage device may erase the victim block(s).

The erase operation of the victim block(s) may be performed using a normal erase operation.

In step S1507, the storage device may update mapping information. Specifically, the storage device may update mapping information indicating a mapping relationship between logical and physical addresses corresponding to the valid data.

Figure 21:
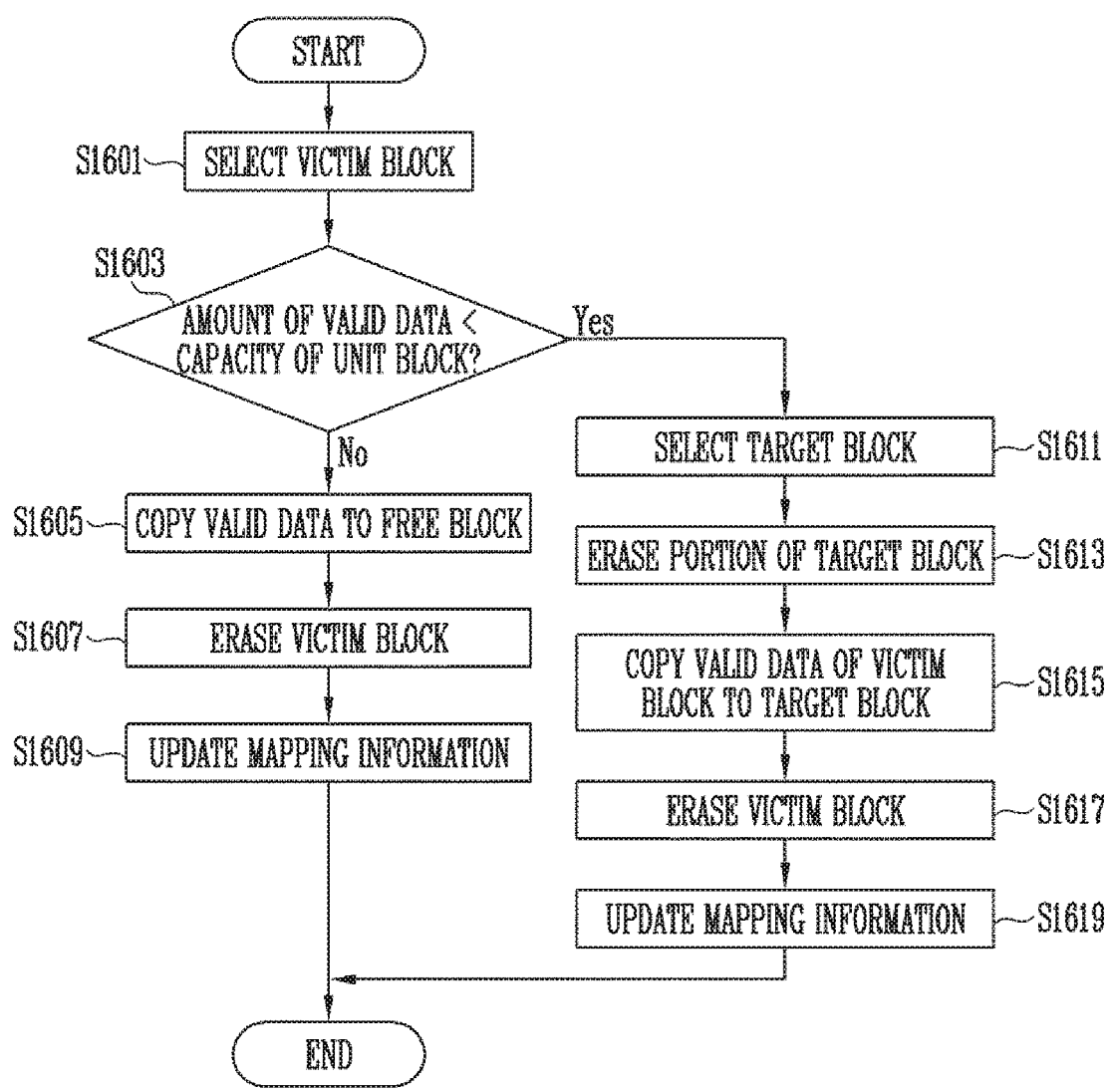
FIG. 21 is a flowchart illustrating an operating method of the storage device according to another embodiment of the present disclosure.

FIG. 21 is a flowchart illustrating an operating method of the storage device according to another embodiment of the present disclosure.

FIG. 21 is a diagram illustrating the garbage control operation performed as a foreground operation, which is described in FIG. 19.

Referring to FIG. 21, in step S1601, a storage device, e.g., storage device 50, may select victim blocks. Specifically, the storage device may select, as a victim block, at least one closed memory block among closed memory blocks. The method of selecting the victim block may be performed based on various references. For example, memory blocks in which the amount of valid data is a certain level or less may be selected as victim blocks. Alternatively, victim blocks may be selected using a ratio of valid data to invalid data.

In step S1603, the storage device may determine whether the amount of valid data in the victim blocks exceeds the storage capacity of one main block. When this is determined in the affirmative, the storage device proceeds to step S1605. When it is determined that the amount of valid data in the victim blocks does not exceed the storage capacity of one main block, the storage device proceeds to step S1611.

In the step S1605, the storage device may copy the valid data to a free block. Specifically, the storage device may read valid pages in which valid data in at least one victim block are stored, and program the read valid data to the free block.

In step S1607, the storage device may erase the victim block(s).

The erase operation of the victim block(s) may be performed using a normal erase operation.

In step S1609, the storage device may update mapping information. Specifically, the storage device may update mapping information indicating a mapping relationship between logical and physical addresses corresponding to the valid data.

In the step S1611, the storage device may select a target block. The target block may be a closed block having an amount of invalid data that is larger than the amount of valid data in the victim blocks.

In step S1613, the storage device may erase a portion of the target block. Specifically, the storage device may erase invalid pages in which invalid data are stored among a plurality of pages in the target block. For example, the storage device may set the invalid pages in the target block to at least one sub-block. The storage device may erase the set sub-block(s) using a partial block erase operation.

In step S1615, the storage device may store the valid data in the victim block(s) In the erased sub-block in the target block.

In step S1617, the storage device may erase the victim block(s).

The erase operation of the victim block(s) may be performed using a normal erase operation.

In step S1619, the storage device may update mapping information. Specifically, the storage device may update mapping information indicating a mapping relationship between logical and physical addresses corresponding to the valid data.

Figure 22:
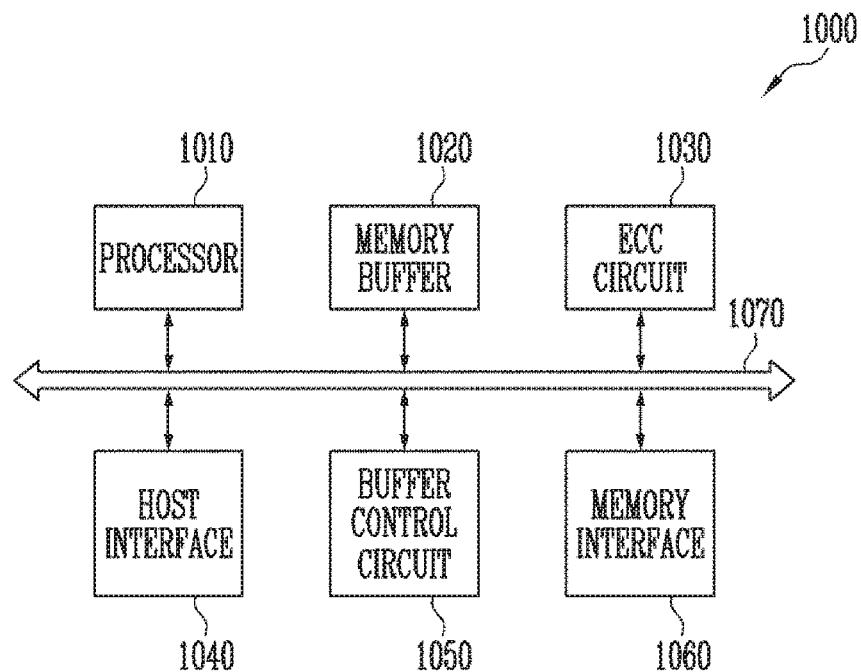
FIG. 22 is a diagram illustrating another embodiment of the memory controller of FIG. 1.

FIG. 22 is a diagram illustrating another embodiment 1000 of the memory controller 200 of FIG. 1.

The memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

Referring to FIG. 22, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050. Either or both of the memory buffer 1020 and the buffer control circuit 1050 may be provided separately or one or both of their functions distributed within the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060.

The control bus may be coupled to the host interface 1040, the processor 1010, the buffer control circuit 1050, the memory buffer 1020, and the memory interface 1060.

Figure 23:
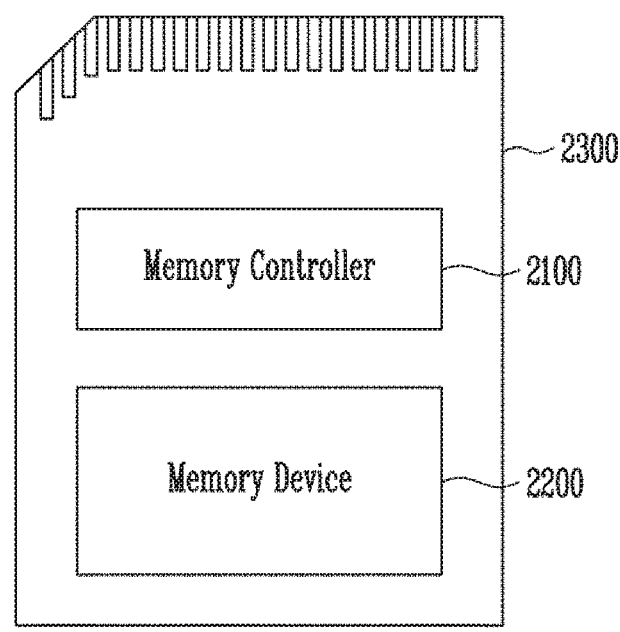
FIG. 23 is a block diagram illustrating a memory card system to which the storage device is applied according to an embodiment of the present disclosure.

FIG. 23 is a block diagram illustrating a memory card system to which the storage device may be applied according to an embodiment of the present disclosure.

Referring to FIG. 23, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory controller 2100 may be implemented identically to the memory controller 200 described with reference to FIG. 1.

In an example, the memory controller 2100 may include components such as a Random Access Memory (RAM), a processor, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device to constitute a memory card such as a PC card (Personal Computer Memory Card International Association (PCM-CIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and/or a Universal Flash Storage (UFS).

Figure 24:
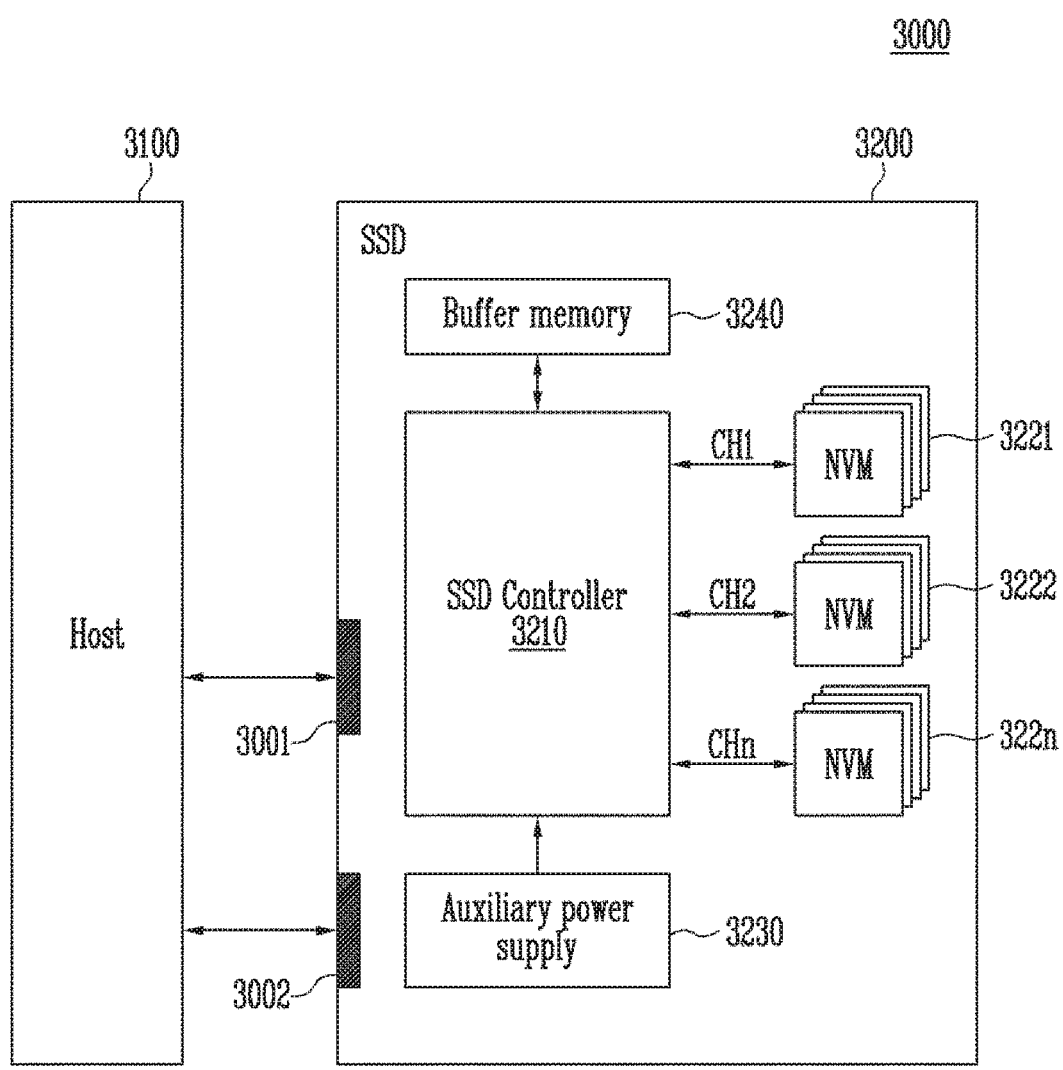
FIG. 24 is a block diagram illustrating a Solid State Drive (SSD) system to which the storage device is applied according to an embodiment of the present disclosure.

FIG. 24 is a block diagram illustrating a Solid State Drive (SSD) system to which the storage device may be applied according to an embodiment of the present disclosure.

Referring to FIG. 24, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 25:
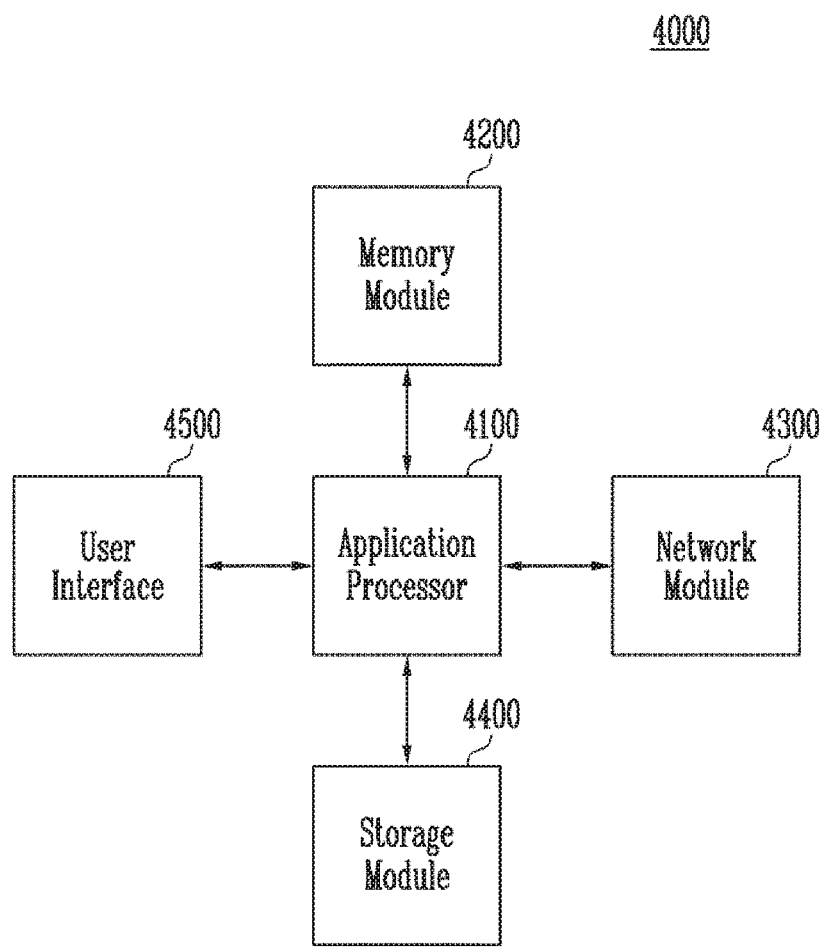
FIG. 25 is a block diagram illustrating a user system to which the storage device is applied according to an embodiment of the present disclosure.

FIG. 25 is a block diagram illustrating a user system to which the storage device may be applied according to an embodiment of the present disclosure.

Referring to FIG. 25, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or volatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA- 2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device described with reference to FIGS. 1 to 11. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a motor.

According to embodiments of the present disclosure, a storage device for performing a garbage collection operation using a partial block erase operation and an operating method of the storage device are provided.

Various embodiments have been disclosed herein, and although specific terms are employed, they are used and are to be interpreted in a generic and descriptive sense and not for purpose of limitation. In some Instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A storage device comprising:
   a memory device including a plurality of memory blocks including a plurality of sub-blocks; and
   a memory controller configured to comprise a system cache buffer storing system information and store the system information in a memory block among the plurality of memory blocks,
   wherein when the system information stored in the system cache buffer is changed, the memory controller erases a portion of a memory block in which original system information corresponding to the changed system information is stored according to whether an amount of the changed system information exceeds a storage capacity of the memory block, and stores the changed system information in the portion.

2. The storage device of claim 1, wherein the portion of the memory block corresponds to at least one sub-block among sub-blocks of the memory block.

3. The storage device of claim 1, wherein the system information comprises at least one of mapping information indicating a mapping relationship between logical addresses and physical addresses, a valid page count, an erase count, or a read count.

4. The storage device of claim 1, wherein the memory controller periodically moves the system information stored in the system cache buffer into the memory block.

5. The storage device of claim 1, wherein the system cache buffer comprises at least one of a Static RAM (SRAM) or a Dynamic RAM (DRAM).

* * * * *